United States Patent
Nagasawa et al.

(10) Patent No.: US 10,295,906 B2
(45) Date of Patent: May 21, 2019

(54) CONDUCTIVE POLYMER COMPOSITION, COATED ARTICLE, AND PATTERNING PROCESS

(71) Applicant: SHIN-ETSU CHEMICAL CO., LTD., Tokyo (JP)

(72) Inventors: Takayuki Nagasawa, Jyoetsu (JP); Jun Hatakeyama, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 111 days.

(21) Appl. No.: 15/259,790

(22) Filed: Sep. 8, 2016

(65) Prior Publication Data

US 2017/0090286 A1 Mar. 30, 2017

(30) Foreign Application Priority Data

Sep. 25, 2015 (JP) .................. 2015-188120

(51) Int. Cl.
*H01B 1/12* (2006.01)
*H01L 51/00* (2006.01)
(Continued)

(52) U.S. Cl.
CPC .............. *G03F 7/093* (2013.01); *C09D 5/24* (2013.01); *C09D 7/00* (2013.01); *C09D 165/00* (2013.01);
(Continued)

(58) Field of Classification Search
CPC ........ H01B 1/124; H01B 1/127; H01B 1/128; H01B 1/20; H01L 51/00; C08L 65/00; C08L 81/02
See application file for complete search history.

(56) References Cited

U.S. PATENT DOCUMENTS

| | | | |
|---|---|---|---|
| 5,370,825 A | 12/1994 | Angelopoulas et al. | |
| 5,437,893 A | 8/1995 | Murai et al. | |
| 7,569,326 B2 * | 8/2009 | Ohsawa | C08F 20/22 430/270.1 |

(Continued)

FOREIGN PATENT DOCUMENTS

| | | |
|---|---|---|
| EP | 2 700 676 A1 | 2/2014 |
| EP | 2 868 698 A1 | 5/2015 |

(Continued)

OTHER PUBLICATIONS

Mar. 15, 2017 Extended Search Report issued in European Patent Application No. 16002059.0.

Primary Examiner — Haidung D Nguyen
(74) Attorney, Agent, or Firm — Oliff PLC

(57) ABSTRACT

A conductive polymer composition including: (A) π-conjugated conductive polymer having at least one repeating unit shown by the following general formulae (1-1), (1-2), and (1-3); (B) a dopant polymer which contains a repeating unit "a" shown by the following general formula (2) and has a weight-average molecular weight in a range of 1,000 to 500,000; and (C) an amphoteric ion compound shown by the following general formula (3). This provides a conductive polymer composition having good filterability, coating property and film-formability onto a substrate to form a conductive film with good film quality and peelability with $H_2O$ or an alkaline developer; and forming a conductive film which reveals antistatic performance with high charge discharging ability and does not affect an influence of acid on the adjoined layer to be contact with.

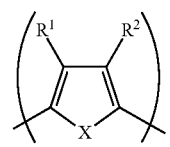

(1-1)

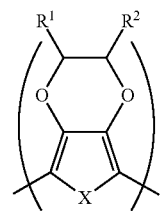

(1-2)

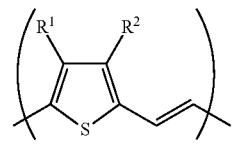

(1-3)

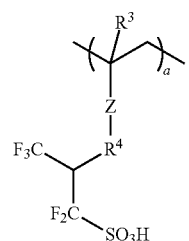

(2)

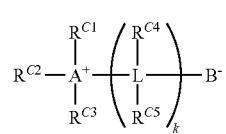

(3)

18 Claims, No Drawings

(51) Int. Cl.
  *G03F 7/09* (2006.01)
  *C09D 5/24* (2006.01)
  *C09D 165/00* (2006.01)
  *G03F 7/20* (2006.01)
  *G03F 7/32* (2006.01)
  *H01J 37/317* (2006.01)
  *H01L 21/027* (2006.01)
  *C09D 7/00* (2018.01)

(52) U.S. Cl.
  CPC ............ *G03F 7/2059* (2013.01); *G03F 7/322* (2013.01); *H01J 37/3174* (2013.01); *H01L 21/0277* (2013.01)

(56) References Cited

U.S. PATENT DOCUMENTS

2007/0231604 A1* 10/2007 Ohkubo ............... C08G 61/122
  428/704
2015/0140492 A1  5/2015 Sawai et al.
2015/0340118 A1* 11/2015 Nagasawa ........... H01L 51/0037
  252/500
2016/0091792 A1*  3/2016 Nagasawa ............... G03F 7/093
  428/195.1

FOREIGN PATENT DOCUMENTS

| EP | 2 947 126 A1 | 11/2015 |
|---|---|---|
| EP | 3 050 932 A1 | 8/2016 |
| JP | 2902727 B2 | 6/1999 |
| JP | 2013-228447 A | 11/2013 |
| JP | 2014-009342 A | 1/2014 |

* cited by examiner

CONDUCTIVE POLYMER COMPOSITION, COATED ARTICLE, AND PATTERNING PROCESS

BACKGROUND OF THE INVENTION

Field of the Invention

The present invention relates to a conductive polymer composition containing a π-conjugated conductive polymer, a coated article using the same, and a patterning process.

Description of the Related Art

Conventionally, in the fabrication process of a semiconductor device such as IC and LSI, microprocessing by lithography using a photoresist has been employed. This is a method of etching a substrate by using a resist pattern as a mask, in which the resist pattern is obtained by irradiating a thin-film with light to induce crosslinking or decomposition reaction, thereby remarkably changing the solubility of the thin-film, and subjecting the same to development treatment with a solvent or the like. In recent years, as a semiconductor device advances toward high integration, high-precision microprocessing using a beam with short wavelength have been required. The development of lithography using electron beam has been progressed for next generation technique because of its short-wavelength properties.

The lithography using electron beam has a specific problem of electrification phenomenon (charge-up) during exposure. This is a phenomenon that when a substrate to be irradiated with electron beam is coated with an insulating resist film, it is charged by accumulation of electric charge on or in the resist film. An orbit of incident electron beam is bent by the electrification, and therefore the precision of drawing is significantly reduced. Accordingly, an antistatic film to be applied on an electron beam resist has been investigated.

In the lithography using an electron beam, accurate positioning has been more important in an electron beam drawing of a resist due to miniaturization to <10 nm generation. As the drawing technology, it has been developing an enhancement of current in prior arts, MBMW (multi beam mask writing), and so on, and it is presumed that the resist will be electrified more severely thereby. Accordingly, a conductive polymer with lower resistivity and higher ability to discharge the charge is required as a means to improve the antistatic performance of an antistatic film coping to the development of drawing technology from now on.

In order to suppress lowering of drawing accuracy due to electrification phenomenon on a resist, Patent Document 1 discloses that the resist is coated with a π-conjugated conductive polymer having an introduced acidic substituent in the structure, and thus formed conductive polymer film shows an antistatic effect in electron beam drawing, thereby dissolving various faults due to electrification such as a deformation of a resist pattern or an electrostatic adverse effect to accurate positioning of lithography in an electron beam irradiation. It is also revealed that the conductive polymer film retains water solubility even after electron beam drawing with high irradiation dosage, and accordingly can be removed by water washing.

Patent Document 2 discloses a composition composed of a polyaniline base conductive polymer, polyacid, and $H_2O$; and reveals that when the composite composed of a polyaniline base conductive polymer and polyacid is 5 to 10% by mass, the spin coat-film forming can be favorably performed, and in addition to this, when the film thickness is 150 nm, antistatic performance is observed, thereby forming an antistatic film which can be peeled and washed with $H_2O$.

The π-conjugated conductive polymer is also used for a device constituent component in a laminated organic thin-film device, other than the foregoing antistatic film use, due to the thin-film forming property. In a device composed of a laminated thin-film structure, the formed conductive thin-film can be used as a carrier implanted layer, which is laminated onto the upper-layer of a film electrode (an application-type transparent electrode) or an electrode (mainly at an anode side, such as a transparent electrode) and has an effect to reduce the transfer barrier of a carrier from the electrode, and as a carrier transferring layer to transfer carriers to an emission layer for an emission phenomenon.

Previously, in organic EL illumination devices or organic EL displays, metal oxides such as ITO with high conductivity and transparency have been used for electrode surfaces to supply electricity to device structures. The ITO, however, contains indium, which is rare metal; and is constructed as an electrode surface by vapor deposition process, thereby having a limit in upsizing of a device or improving the productivity. Accordingly, it has been required for developing a conductive material which is low cost and can form larger surface by a simpler surface-forming method with high productivity.

Since inorganic materials such as ITO do not have flexibility, it is difficult to be applied to prospective flexible laminated organic thin-film devices. Accordingly, in order to make a device have such additional functions in the future, it requires a material for a device constituent component with durability for curvature.

As compared to the foregoing inorganic transparent electrode materials such as ITO, π-conjugated conductive polymers have flexibility after film-forming, and the film-forming method thereof can include a wet process such as spin coating or printing. In film-forming by a wet process, the film-forming time can be shortened compared to dry processes such as vapor deposition, sputtering, and CVD even in the case of single wafer application such as spin coating. When the film-forming can be performed by Role to Role printing onto a flexible substrate, the productivity is tremendously improved, and increasing the area is accelerated.

In the laminated organic thin-film devices, the π-conjugated conductive polymer functions not only as a substituted material for ITO, but also as a carrier implanted layer or a carrier transferring layer in accordance with a device structure. In a laminated structure of a device, the carrier implanted layer is located onto an upper-layer of an electrode surface, and the carrier transferring layer is located between the carrier implanted layer and an emission layer for emission or between an electrode surface and the emission layer. In construction of a device, the foregoing are laminated successively onto a substrate beginning with the outmost layer of the device structure.

In the construction of the laminated organic thin-film devices, a wet process is very effective for film-forming and laminating each constituent component. In a process to laminate a particular layer onto an under-layer film, however, the under-layer have to be composed of a material which is not dissolved or peeled by the solvent of the upper-layer. That is, it is necessary to meet a condition in which the solid content of material forming each layer is not dissolved into the solvent of a material forming the adjoined layer.

In the laminated organic thin-film devices, the layers are in surface contact so as to transfer carriers between each laminated layer in high efficiency. When there occurs transference of a substance other than the carrier between the contact surfaces or mixing of each constituent component at the interface, they influence the degradation life of a device. Accordingly, each material has to be structured so as to contact with each other without interaction between each constitution layer, and the material is required to meet the condition.

PRIOR ART DOCUMENTS

Patent Documents

Patent Document 1: Japanese Patent No. 2902727
Patent Document 2: U.S. Pat. No. 5,370,825
Patent Document 3: Japanese Patent Laid-Open Publication No. 2014-009342

SUMMARY OF THE INVENTION

The antistatic film for electron beam drawing revealed in Patent Document 1 uses a π-conjugated conductive polymer in which an acidic substituent is introduced into one monomer unit structure thereof, and forms self-doping of the acidic substituent to the π-conjugated conductive polymer chain. Accordingly, the acidic substituent and the monomer composing the π-conjugated conductive polymer are always contained in a ratio of 1:1, which makes it difficult to alter the doping ratio of the π-conjugated conductive polymer and the acidic substituent in order to adapt to the use and the object. Moreover, it is also difficult to alter the ratio of the non-doping acidic substituent, which largely influences properties such as solubility or dispersity to $H_2O$, and re-aggregation. Accordingly, there has been a problem such as causing re-aggregation during the storage to make the liquid inhomogeneous and to generate a defect easily in peeling step when applied as an antistatic film onto a resist.

In the composition described in Patent Document 2, the composite composed of the polyaniline base conductive polymer and polyacid has high $H_2O$-affinity among various composites composed of a π-conjugated conductive polymer and polyacids, and accordingly shows rapid response in a $H_2O$-peeling and washing step in the use of an antistatic film for electron beam lithography. On the other hand, its low resistivity, which is a property index to show antistatic performance, is hard to improve remarkably. Accordingly, the composition can fail to cope with sufficient discharging the charge in a prospective drawing process, which will intensely generate the foregoing electrification condition of a resist layer.

The composition described in Patent Document 2 is based on a composite composed of a polyaniline base conductive polymer and polyacid. The acid substituents of the polyacid are not completely neutralized to form salts in the composite, and the dispersion containing the composite shows acidity thereby. Accordingly, in film-forming onto a resist upper-layer for the antistatic film use in electron beam lithography, acid due to the acid substituents of the polyacid diffuses into the resist film with the passage of time after film-forming or during a heating to enhance chemically amplified reaction after a drawing step on the resist (PEB: post exposure bake) to cause degradation of a pattern profile in lithography.

The π-conjugated conductive polymers used for antistatic film use include polythiophene base conductive polymers except for the polyaniline base conductive polymers. The polythiophene base conductive polymer generally shows higher conductivity compared to polyaniline base conductive polymers, but has lower affinity to $H_2O$ compared to polyaniline base conductive polymers. Accordingly, in a $H_2O$-peeling and washing step after film-forming, the formed film is not fully dissolved but is peeled in a form of flakes even in the material being dispersed into $H_2O$, and can cause a serious defect in lithography thereby.

Patent Document 3 discloses a technology used for an antistatic film for electron beam lithography of a polythiophene base conductive polymer, which reveals a composite of a polythiophene base conductive polymer and polyaniline having an antistatic film function and good peelability to $H_2O$ effected by an addition of gemini surfactant, etc. The composition described in Patent Document 3 comprises a composite of a polythiophene base conductive polymer and polyacid as a base polymer, and accordingly acid due to the polyacid can influence the resist film as the composite composed of the polyaniline base conductive polymer and polyacid described in Patent Document 2. To this problem, Patent Document 3 uses a neutralization agent such as amines to moderate the acidity, thereby keeping the influence on lithography to a minimum. However, when gemini surfactant is added in order to apply functions of good coating property and peelability, and amine is added in order to moderate the acidity, the film shows an equivalent or larger surface resistivity (Ω/□), which is an index of antistatic performance, compared to the polyaniline base antistatic film described in Patent Document 2, and in conclusion, it fails to reveal the high-conductivity function intrinsic to the polythiophene base conductive polymer. Therefore, it is feared to fail to cope with the sufficient discharging of the charge in a drawing process, requiring high antistatic property in future.

On account of the foregoing, it has been required to develop an antistatic film for electron beam-resist drawing having good filterability and good film-formability onto an electron beam resist to form a flat film, without affecting chemical influence of acid on a resist film, showing excellent antistatic performance even in an electron beam-resist drawing step on the basis of the low surface resistivity (Ω/□), and having good peelability with $H_2O$ or an alkaline developer after the drawing.

On the other hand, as a thin-film transparent electrode and a carrier implanted layer on an anode side, metal oxides such as ITO and $MoO_3$ have been generally used. However, all of them are laminated by vapor deposition, and accordingly have a limit for upsizing a substrate or improving a product efficiency. Moreover, inorganic solid materials such as metal oxides have problems such as being weak to breakage and an obstacle to enhance the productivity in construction of a flexible device or a device production in a printable process by use of a prospective flexible substrate.

Regarding application-type transparent electrodes, carrier implanted layers, and carrier transferring layers, film-forming and lamination have been attempted by using π-conjugated conductive polymers. However, there has been problems of peeling after film-forming when the upper-layer of the film is applied, as well as mixing at the interface and diffusion of acid due to the material into the adjoined layer even when the upper-layer could be laminated. The π-conjugated conductive polymer, which is a $H_2O$-dispersed liquid material, frequently causes defects and problems of film-formability or storage stability due to the high viscosity and strong cohesiveness. The $H_2O$-dispersed liquid material of a π-conjugated conductive polymer material basically has high acidity in many cases, and accordingly base such as ammonia and amines is added practically in order to moderate the acidity in some cases. The addition of these additives, however, causes to increase the cohesiveness due to the strong nucleophilicity or water-insolubility in many amines, and accordingly the filterability and film-formability are degraded, and causes de-dopant or precipitation of the π-conjugated conductive polymer, or layer separation during storage.

On account of the foregoing, it has been required to develop a material by which good filterability and good film-formability are realized, another material can be applied onto the upper-layer as a constituent component of a laminated device; the adjoined layer is not mixed at the interface after the lamination; the acidity is moderated, and the acid diffusion into the adjoined layer is suppressed. It has also been required for a conductive polymer material which does not cause de-dopant or precipitation of the π-conjugated conductive polymer and an increase of the agglomeration even after the properties are provided.

The present invention was made in view of the above circumstances, and an object thereof is to provide a conductive polymer composition having good filterability, good coating property and film-formability onto a substrate to form a conductive film with good film quality, and good peelability with H$_2$O or an alkaline developer; and forming a conductive film which reveals antistatic performance with high charge discharging ability and does not affect an influence of acid on the adjoined layer to be contact with; thereby being suitably usable for a antistatic film in resist lithography using electron beam and so on, and a transparent electrode, a carrier implanted layer, and a carrier transferring layer of an organic thin-film device.

To accomplish the object, the present invention provides a conductive polymer composition comprising:

(A) a π-conjugated conductive polymer having at least one repeating unit shown by the following general formulae (1-1), (1-2), and (1-3);

(B) a dopant polymer which contains a repeating unit "a" shown by the following general formula (2) and has a weight-average molecular weight in a range of 1,000 to 500,000; and (C) an amphoteric ion compound shown by the following general formula (3);

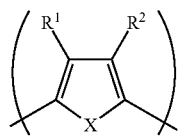
(1-1)

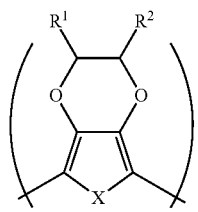
(1-2)

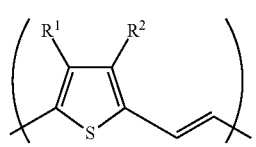
(1-3)

wherein "X" represents S, O, Se, Te, or NR$^5$; R$^1$ and R$^2$ each independently represent any of a hydrogen atom, a hydroxy group, a halogen atom, and a linear, branched, or cyclic monovalent hydrocarbon group having 1 to 20 carbon atoms and optionally containing a heteroatom; R$^1$ and R$^2$ may be bonded to each other at any positions to form a ring; R$^5$ represents a hydrogen atom, a linear or branched saturated or unsaturated alkyl group having 1 to 10 carbon atoms, or a substituted or unsubstituted aryl group having 6 to 10 carbon atoms;

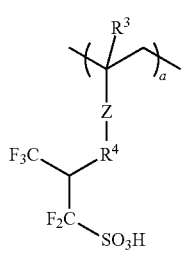
(2)

wherein R$^3$ represents a hydrogen atom or a methyl group; R$^4$ represents any of a single bond, an ester group, or a linear, branched, or cyclic hydrocarbon group having 1 to 12 carbon atoms and optionally containing either or both of an ether group and an ester group; "Z" represents any of a phenylene group, a naphthylene group, and an ester group; and "a" is 0<a≤1.0;

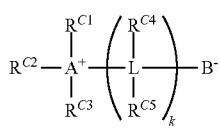
(3)

wherein R$^{C1}$ to R$^{C3}$ each independently represent a hydrogen atom, or a linear, branched, or cyclic monovalent hydrocarbon group having 1 to 20 carbon atoms and optionally substituted by a heteroatom or optionally interposed by a heteroatom; R$^{C1}$ and R$^{C2}$, or R$^{C1}$, R$^{C2}$, and R$^{C3}$ may be bonded to each other to form a ring with A$^+$ in the formula; A$^+$ is a heteroatom and represents a monovalent cation; "k" represents an integer of 1 to 8; "L" represents a carbon atom or a heteroatom, and may contain the both of them when "k" is 2 or more; R$^{C4}$ and R$^{C5}$ independently represent a hydrogen atom, a hydroxy group, an amino group, or a linear, branched, or cyclic monovalent hydrocarbon group having 1 to 20 carbon atoms and optionally interposed by a heteroatom; R$^{C4}$ and R$^{C5}$ may be bonded to each other to form a ring, and adjoining R$^{C4}$ may be bonded to each other to form a ring when "k" is 2 or more; R$^{C4}$ and R$^{C5}$ may be bonded to an oxygen atom or a nitrogen atom to form a double bond, and when R$^{C4}$ and R$^{C5}$ form a double bond with a nitrogen atom, the nitrogen atom can be an ion; "L" may form a double bond with adjoining A$^+$, and adjoining "L" may form a double bond with each other when "k" is 2 or more; any of R$^{C1}$ to R$^{C3}$ and R$^{C4}$ or R$^{C5}$ may be bonded to each other to form a ring; B$^-$ is a monovalent anionic functional group and represents a carboxylate ion or a sulfonate ion.

Such a conductive polymer composition can be a conductive polymer composition that has good coating property and film-formability onto a substrate as well as filterability to form a conductive film with good film quality, and good peelability with H₂O or an aqueous alkaline solution; and the formed conductive film realizes antistatic performance with high charge discharging ability and does not affect an influence of acid on the adjoined layer to be contact with; thereby being suitably usable for a antistatic film in resist lithography using electron beam and so on, and a transparent electrode, a carrier implanted layer, and a carrier transferring layer of an organic thin-film device.

The repeating unit "a" in the component (B) preferably contains one or more repeating units selected from repeating units a1 to a7 shown by the following general formulae (2-1) to (2-7),

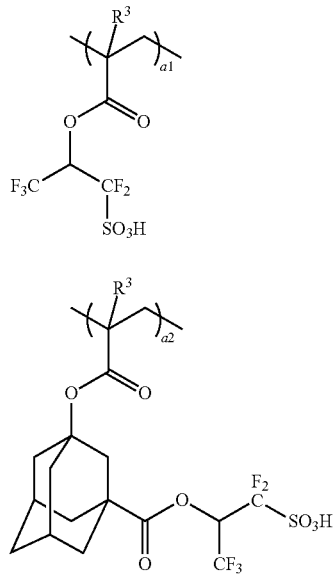

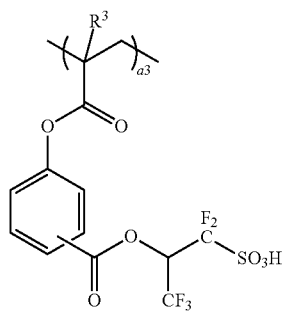

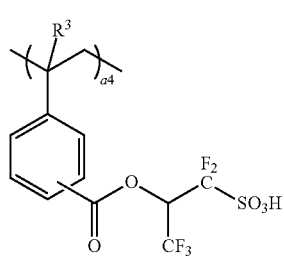

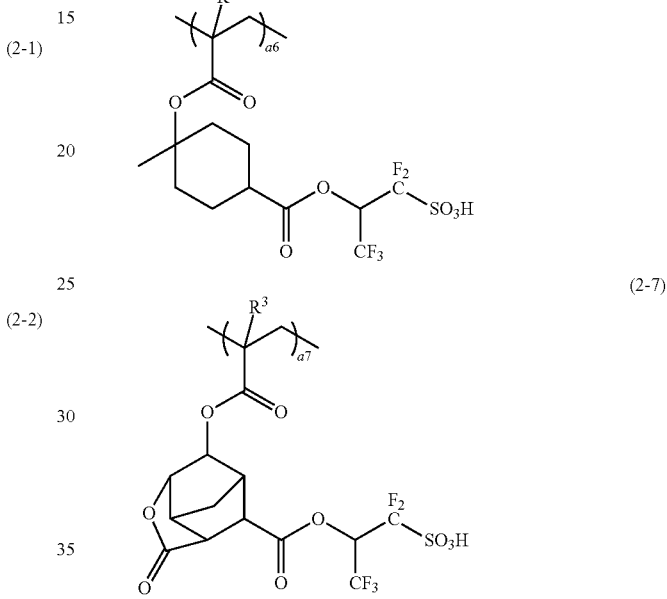

wherein $R^3$ has the same meaning as defined above; a1, a2, a3, a4, a5, a6, and a7 are each $0 \leq a1 \leq 1.0$, $0 \leq a2 \leq 1.0$, $0 \leq a3 \leq 1.0$, $0 \leq a4 \leq 1.0$, $0 \leq a5 \leq 1.0$, $0 \leq a6 \leq 1.0$, $0 \leq a7 \leq 1.0$, and $0 < a1+a2+a3+a4+a5+a6+a7 \leq 1.0$.

Such a component (B) has low viscosity, good filterability, and excellent film-formability on an electron beam resist by spin coating; and can form an antistatic film with good flatness and conductivity in film-forming. Moreover, the formed film shows excellent peelability with H₂O or an aqueous alkaline solution.

Preferably, the component (B) further contains a repeating unit "b" shown by the following general formula (4),

wherein "b" is $0 < b < 1.0$.

With containing such a repeating unit "b", it is possible to further improve the conductivity.

The component (C) is preferably shown by the general formula (5),

(5)

wherein $R^{C1}$ to $R^{C5}$, $A^+$, "L", and "k" have the same meanings as defined above.

With containing the amphoteric ion compound shown by the general formula (5) as the component (C), it is possible to moderate the acidity of a composite composed of the component (A) and the component (B), thereby being able to control the acidity by which the acid does not influence on the adjoined layer. Accordingly, it is possible to moderate the influence of acid on a body to be processed or the adjoined layer in a laminated structure by the acid of the conductive polymer composition before applying and film-forming onto the body to be processed or the film after the film-forming.

The component (C) is preferably in an amount of 1 to 70 parts by mass based on 100 parts by mass of a composite of the component (A) and the component (B).

When the component (C) is in such an amount, it is possible to reduce acid diffusion from the conductive film formed by the conductive polymer composition to the adjoined layer to be contact with. When such a conductive film is formed onto a body to be processed which is a substrate with a chemically amplified resist film, and is intended for an antistatic effect in electron beam drawing, it is possible to realize the antistatic effect with suppressing an influence of the acid to lithography, and to obtain a high-resolution resist pattern. On the basis of the same effect, it is also possible to obtain a resist body to be processed with small change in sensitivity over a period from film-forming to pattern development.

When using the film formed from the conductive polymer composition as a constituent component of organic thin-film laminated devices such as an organic EL and an organic solar cell, such content of the component (C) can exclude factors for degrading a device such as inhibition of functions and corrosion due to acid in the adjoined layer as the upper-layer or the lower-layer of the film. Accordingly, it is possible to construct an organic thin-film laminated device with long-life and high-function efficiency. In the production process of such an organic thin-film laminated device, when the upper-layer of the film is subjected to application and film-forming of another layer-forming material which uses an organic solvent as a solvent, such content also makes it possible to avoid peeling of the film or mixing with the upper-layer.

It is also preferable for the component (C) to be in an amount of 20 to 50 parts by mass based on 100 parts by mass of a composite of the component (A) and the component (B).

When the component (C) is in such an amount, it is possible to further reduce acid diffusion from the conductive film formed by the conductive polymer composition to the adjoined layer to be contact with. When such a conductive film is formed onto a body to be processed which is a substrate with a chemically amplified resist film, and is intended for an antistatic effect in electron beam drawing, it is possible to realize the antistatic effect with suppressing an influence of the acid to lithography, and to obtain a high-resolution resist pattern. On the basis of the same effect, it is also possible to obtain a resist body to be processed with smaller change in sensitivity over a period from film-forming to pattern development.

When using the film formed from the conductive polymer composition as a constituent component of organic thin-film laminated devices such as an organic EL and an organic solar cell, such content of the component (C) can further exclude factors for degrading a device such as inhibition of functions and corrosion due to acid in the adjoined layer as the upper-layer or the lower-layer of the film. Accordingly, it is possible to construct an organic thin-film laminated device with longer-life and higher-function efficiency. In the production process of such an organic thin-film laminated device, when the upper-layer of the film is subjected to application and film-forming of another layer-forming material which uses an organic solvent as a solvent, such content also makes it possible to avoid peeling of the film or mixing with the upper-layer more effectively.

It is preferred that the conductive polymer composition further comprise a nonionic surfactant.

Such a conductive polymer composition improves the wettability to a body to be processed such as a substrate.

The nonionic surfactant is preferably in an amount of 1 to 50 parts by mass based on 100 parts by mass of a composite of the component (A) and the component (B).

Such a conductive polymer composition makes the wettability to the surface of a body to be processed more suitable, and give the conductive film sufficient conductivity.

The conductive polymer composition is preferably a material for forming a laminated film as a device constituent component in an organic thin-film device.

The inventive conductive polymer composition has good filterability and can be applied onto any of bodies to be processed to form a film. Accordingly, it is suitable for a material for forming a laminated film as a device constituent component in an organic thin-film device other than the use of an antistatic film, and it can be used for forming a homogeneous thin-film with high flatness.

The conductive polymer composition is preferably a material for forming an electrode film or a material for forming a carrier transferring film.

The inventive conductive polymer composition has excellent conductivity and film-formability as well as transparency, and accordingly it is suitable as a material for forming an electrode film. It also has a character to show highly efficient carrier transfer due to the π-conjugated network, and accordingly it is suitable as a material for forming a carrier transferring film.

The present invention also provides a coated article, comprising a film formed from the foregoing conductive polymer composition on a body to be processed.

The conductive film formed from the inventive conductive polymer composition can be coated onto various body to be processed such as a substrate of an organic thin-film device or an electrode film formed onto a substrate to give a high-quality coated article.

The body to be processed can be a substrate having a chemically amplified resist film.

The inventive conductive polymer composition does not affect a bad influence of acid on a resist. Accordingly, it is possible to adopt a substrate having a chemically amplified resist film, which was difficult to be applied, as a body to be processed to be provided with an antistatic film formed from the conductive polymer composition according to the present invention.

The body to be processed can be a substrate for obtaining a resist pattern by pattern irradiation with electron beam.

The inventive conductive polymer composition can be suitably used for a lithography particularly by use of electron beam, etc. Accordingly, it is possible to obtain a resist pattern with high sensitivity, high resolution, and a good pattern profile.

The present invention further provides a patterning process comprising the steps of: forming an antistatic film on a chemically amplified resist film of a substrate having the chemically amplified resist film by using the foregoing conductive polymer composition; irradiating in a pattern with electron beam; and developing with an alkaline developer to obtain a resist pattern.

Such a patterning process can avoid an electron beam distortion phenomenon due to charge of the surface of a resist during electron beam drawing, and can give a resist pattern with high sensitivity and high resolution as well as good pattern profile.

As described above, the inventive conductive polymer composition, which contains an amphoteric ion compound of the component (C) and a composite formed from a π-conjugated conductive polymer of the component (A) and a super-acidic sulfo group-containing dopant polymer of the component (B), has a low viscosity and good filterability; exhibits excellent coating property, film-formability, and flatness of a film on a substrate; can control an influence of acid to the adjoined layer with the component (C) moderating the acidity of the composition; and can form a conductive film having good conductivity, attaining antistatic ability with high charge discharging capacity, and having good film quality. In the inventive composition containing a composite of the component (A) and the component (B), the component (C) does not hinder the peelability by $H_2O$ or an aqueous alkaline solution after the film-forming. Such a conductive film can be suitably applied to an antistatic film of an electron beam resist, and can improve the positional accuracy in an electron beam drawing, while suppressing degradation of lithography due to an influence of acid on the resist film. The film is easily peeled by $H_2O$ or an aqueous alkaline solution, can be peeled by $H_2O$ before a heat treatment after electron beam drawing, can also be peeled by an aqueous alkaline solution (an alkaline developer) as an elution part of a resist pattern in a developing step of a resist pattern in a lithography after a heat treatment subsequent to an electron beam drawing. Such easy film-peeling by $H_2O$ or an aqueous alkaline solution gives an effect of lowering particle defects due to film-forming material in a peeling step after electron beam drawing. Moreover, the presence of the component (C) remarkably improves resistance to organic solvents of a film after film-forming of the composition, and makes it possible to keep the film quality in contact with an organic solvent. This improvement in resistance to organic solvents of this formed film is very effective when applying the inventive composition as a constituent component in a laminated structure of an organic thin-film device. This makes it possible to introduce a wet process such as spin coating or printing to a process to laminate an adjoined layer onto the upper-layer of the film in device production, and brings an effect to lower an interaction with the adjoined layer after being laminated.

DETAILED DESCRIPTION OF THE PREFERRED EMBODIMENTS

As described above, it has been required for a conductive polymer composition having good filterability, good coating property and film-formability onto a substrate to form a conductive film with good film quality, and good peelability with $H_2O$ or an aqueous alkaline solution; and forming a conductive film which reveals antistatic performance with high charge discharging ability and does not affect an influence of acid on the adjoined layer to be contact with; thereby being suitably usable for a antistatic film in resist lithography using electron-beam and so on, as well as a transparent electrode, a carrier implanted layer, and a carrier transferring layer of an organic thin-film device.

The present inventors have intensively investigated to solve the above-described problems, and consequently found that by adding an amphoteric ion compound of the component (C) to a dispersion of a composite of a π-conjugated conductive polymer of the component (A) and a super-acidic sulfo group-containing dopant polymer of the component (B) having a repeating unit which contains a sulfo group with the α-position is fluorinated instead of polystyrenesulfonic acid (PSS) widely used as a dopant for a conductive polymer material, the acidic character of the dispersion of a composite of the component (A) and the component (B) can be moderated, thereby suppressing the influence of the acid on the adjoined layer to be contact with the film, and can form a conductive polymer composition in which good filterability and film-formability are attained, the formed film shows good flatness and low surface resistivity (Ω/□) as well as good peelability with $H_2O$ or an aqueous alkaline solution. The present inventors have also found that the resistance to organic solvents after film forming is remarkably improved by adding an amphoteric ion compound of the component (C) to a composite of the component (A) and the component (B), and accordingly the film formed from the inventive composition can be newly subjected to application and film-forming of another material based on an organic solvent in a laminated structure in an organic thin-film device; thereby brought the present invention to completion.

That is, the present invention is a conductive polymer composition comprising:

(A) a π-conjugated conductive polymer having at least one repeating unit shown by the following general formulae (1-1), (1-2), and (1-3);

(B) a dopant polymer which contains a repeating unit "a" shown by the following general formula (2) and has a weight-average molecular weight in a range of 1,000 to 500,000; and (C) an amphoteric ion compound shown by the following general formula (3);

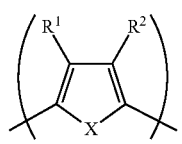

(1-1)

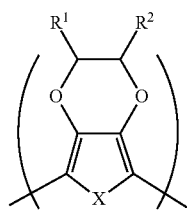

(1-2)

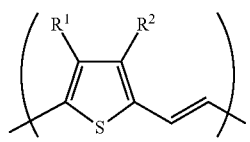

(1-3)

wherein "X" represents S, O, Se, Te, or NR⁵; $R^1$ and $R^2$ each independently represent any of a hydrogen atom, a hydroxy group, a halogen atom, and a linear, branched, or cyclic monovalent hydrocarbon group having 1 to 20 carbon atoms and optionally containing a heteroatom; $R^1$ and $R^2$ may be bonded to each other at any positions to form a ring; $R^5$ represents a hydrogen atom, a linear or branched saturated or unsaturated alkyl group having 1 to 10 carbon atoms, or a substituted or unsubstituted aryl group having 6 to 10 carbon atoms;

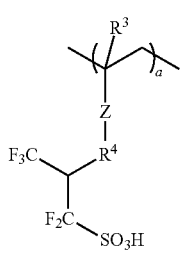

(2)

wherein $R^3$ represents a hydrogen atom or a methyl group; $R^4$ represents any of a single bond, an ester group, or a linear, branched, or cyclic hydrocarbon group having 1 to 12 carbon atoms and optionally containing either or both of an ether group and an ester group; "Z" represents any of a phenylene group, a naphthylene group, and an ester group; and "a" is 0<a≤1.0;

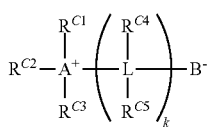

(3)

wherein $R^{C1}$ to $R^{C3}$ each independently represent a hydrogen atom, or a linear, branched, or cyclic monovalent hydrocarbon group having 1 to 20 carbon atoms and optionally substituted by a heteroatom or optionally interposed by a heteroatom; $R^{C1}$ and $R^{C2}$, or $R^{C1}$, $R^{C2}$, and $R^{C3}$ may be bonded to each other to form a ring with A⁺ in the formula; A⁺ is a heteroatom and represents a monovalent cation; "k" represents an integer of 1 to 8; "L" represents a carbon atom or a heteroatom, and may contain the both of them when "k" is 2 or more; $R^{C4}$ and $R^{C5}$ independently represent a hydrogen atom, a hydroxy group, an amino group, or a linear, branched, or cyclic monovalent hydrocarbon group having 1 to 20 carbon atoms and optionally interposed by a heteroatom; $R^{C4}$ and $R^{C5}$ may be bonded to each other to form a ring, and adjoining $R^{C4}$ may be bonded to each other to form a ring when "k" is 2 or more; $R^{C4}$ and $R^{C5}$ may be bonded to an oxygen atom or a nitrogen atom to form a double bond, and when $R^{C4}$ and $R^{C5}$ form a double bond with a nitrogen atom, the nitrogen atom can be an ion; "L" may form a double bond with adjoining A⁺, and adjoining "L" may form a double bond with each other when "k" is 2 or more; any of $R^{C1}$ to $R^{C3}$ and $R^{C4}$ or $R^{C5}$ may be bonded to each other to form a ring; B⁻ is a monovalent anionic functional group and represents a carboxylate ion or a sulfonate ion.

It is possible to obtain the inventive conductive polymer composition, which is suitably used for the foregoing uses, by mixing the composite formed from a π-conjugated conductive polymer of the component (A) and a super-acidic sulfo group-containing depart polymer of the component (B) with a solvent, and an amphoteric ion compound of the component (C), additionally with water-soluble polymer, surfactant, and so on if needed, followed by filtration thereof with a filter, etc., for example. It is possible to obtain a coated article and a substrate having a thin-film formed from the inventive conductive polymer composition by applying the inventive conductive polymer composition onto a substrate, heat treatment, irradiating with IR or UV, etc.

Hereinafter, the present invention will be described specifically, but the present invention is not limited thereto. It is to be noted that the term "conductive" means "electrically conductive" in this description.

[(A) π-Conjugated Conductive Polymer]

The inventive conductive polymer composition contains a π-conjugated conductive polymer which has at least one repeating unit shown by the following general formulae (1-1), (1-2), and (1-3) as the component (A),

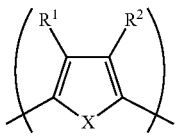

(1-1)

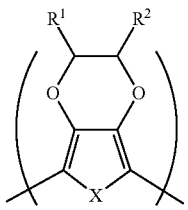

(1-2)

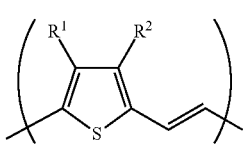

(1-3)

wherein "X" represents S, O, Se, Te, or NR⁵; $R^1$ and $R^2$ each independently represent any of a hydrogen atom, a hydroxy group, a halogen atom, and a linear, branched, or cyclic monovalent hydrocarbon group having 1 to 20 carbon atoms and optionally containing a heteroatom; $R^1$ and $R^2$ may be bonded to each other at any positions to form a ring; $R^5$ represents a hydrogen atom, a linear or branched saturated or unsaturated alkyl group having 1 to 10 carbon atoms, or a substituted or unsubstituted aryl group having 6 to 10 carbon atoms.

The component (A) have only to be a polymerizate of a precursor (an organic monomeric molecule) of a heterocyclic compound containing a nitrogen atom or a chalcogen element, forming a π-conjugated chain (a structure of alternating single bonds and double bonds). Illustrative examples of such a precursor monomer include pyrroles, furans, thiophenes, thiophenevinylenes, selenophenes, tellurophenes. Homopolymers or copolymers of these monomers can be used as the component (A).

Among the foregoing monomers, thiophenes and the derivatives thereof are particularly preferable in view of easy handling and polymerization, stability in the air, but not limited thereto.

The component (A) can obtain sufficient conductivity even when the π-conjugated conductive polymer is constituted of the unsubstituted monomer, however, it is also possible to use a monomer substituted with an alkyl group, a carboxy group, a sulfo group, an alkoxy group, a hydroxy group, a cyano group, halogen atoms in order to further improve the conductivity.

Illustrative examples of such a monomer to form the π-conjugated conductive polymer include pyrrole, N-methylpyrrole, 3-methylpyrrole, 3-ethylpyrrole, 3-n-propylpyrrole, 3-butylpyrrole, 3-octylpyrrole, 3-decylpyrrole, 3-docecylpyrrole, 3,4-dimethylpyrrole, 3,4-dibutylpyrrole, 3-carboxypyrrole, 3-methyl-4-carboxypyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole; thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylenedioxythiophene, 3,4-propylenedioxythiophene, 3,4-butenedioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene.

Among them, a (co)polymer composed of one or two monomers selected from thiophene, 3-methylthiophene, 3-methoxythiophene, and 3,4-ethylenedioxythiophene is suitably used in view of the resistivity and reactivity. Furthermore, the homopolymer of 3,4-ethylenedioxythiophene has high conductivity, and is more preferable.

The component (A) is preferably a polymerizate of one or more precursor monomers to give a repeating unit shown by the foregoing general formulae (1-1) and (1-2), wherein "X" is selected from S, O, Se, and Te. Such a monomer is easily polymerized and stable in the air, and accordingly the component (A) can be easily synthesized.

For practical reasons, the repeating number of these repeating units (precursor monomers) in the component (A) is preferably in a range of 2 to 20, more preferably in a range of 6 to 15.

The molecular weight of the component (A) is preferably about 130 to 5,000.

[(B) Dopant Polymer]

The inventive conductive polymer composition contains a dopant polymer as the component (B). This dopant polymer of the component (B) contains a repeating unit "a" shown by the following general formula (2). That is, the dopant polymer of the component (B) is a super-acidic polymer containing a sulfonic acid in which the α-position is fluorinated,

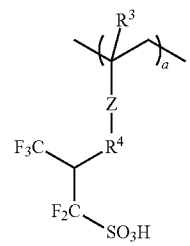

(2)

wherein $R^3$ represents a hydrogen atom or a methyl group; $R^4$ represents any of a single bond, an ester group, or a linear, branched, or cyclic hydrocarbon group having 1 to 12 carbon atoms and optionally containing either or both of an ether group and an ester group; "Z" represents any of a phenylene group, a naphthylene group, and an ester group; and "a" is $0<a\leq1.0$.

In the general formula (2), $R^3$ represents a hydrogen atom or a methyl group.

$R^4$ represents any of a single bond, an ester group, or a linear, branched, or cyclic hydrocarbon group having 1 to 12 carbon atoms and optionally containing either or both of an ether group and an ester group. Illustrative examples of the hydrocarbon group include an alkylene group, an arylene group, and an alkenylene group.

"Z" represents any of a phenylene group, a naphthylene group, and an ester group.

"a" is $0<a\leq1.0$, preferably $0.2\leq a\leq1.0$.

The repeating unit "a" preferably contains one or more repeating units selected from repeating units a1 to a7 shown by the following general formulae (2-1) to (2-7)

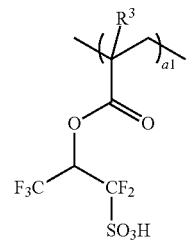

(2-1)

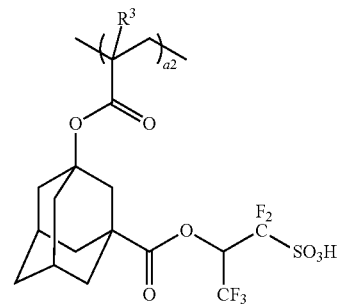

(2-2)

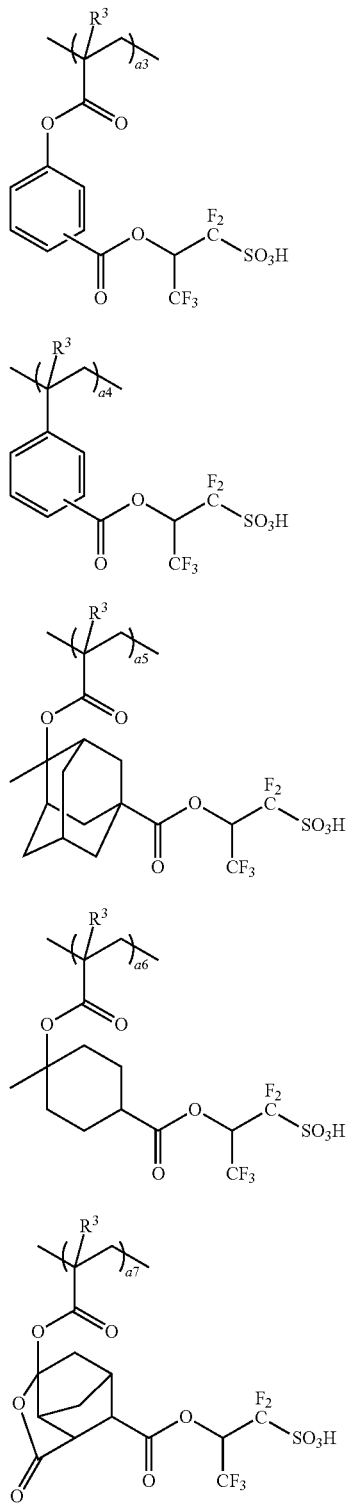

wherein $R^3$ has the same meaning as defined above; a1, a2, a3, a4, a5, a6, and a7 are each $0 \le a1 \le 1.0$, $0 \le a2 \le 1.0$, $0 \le a3 \le 1.0$, $0 \le a4 \le 1.0$, $0 \le a5 \le 1.0$, $0 \le a6 \le 1.0$, $0 \le a7 \le 1.0$, and $0 < a1+a2+a3+a4+a5+a6+a7 \le 1.0$.

Such a component (B) allows the composition in which the dispersion of the composite with the component (A) was mixed with an amphoteric ion compound of the component (C) to have good filterability and film-formability in spin coating on an electron beam resist, to form an antistatic film with good flatness and good conductivity when film-forming, and to form a film with extremely good peelability with $H_2O$ or an aqueous alkaline solution (an alkaline developer).

Illustrative examples of the monomer to give the repeating unit "a" include the following:

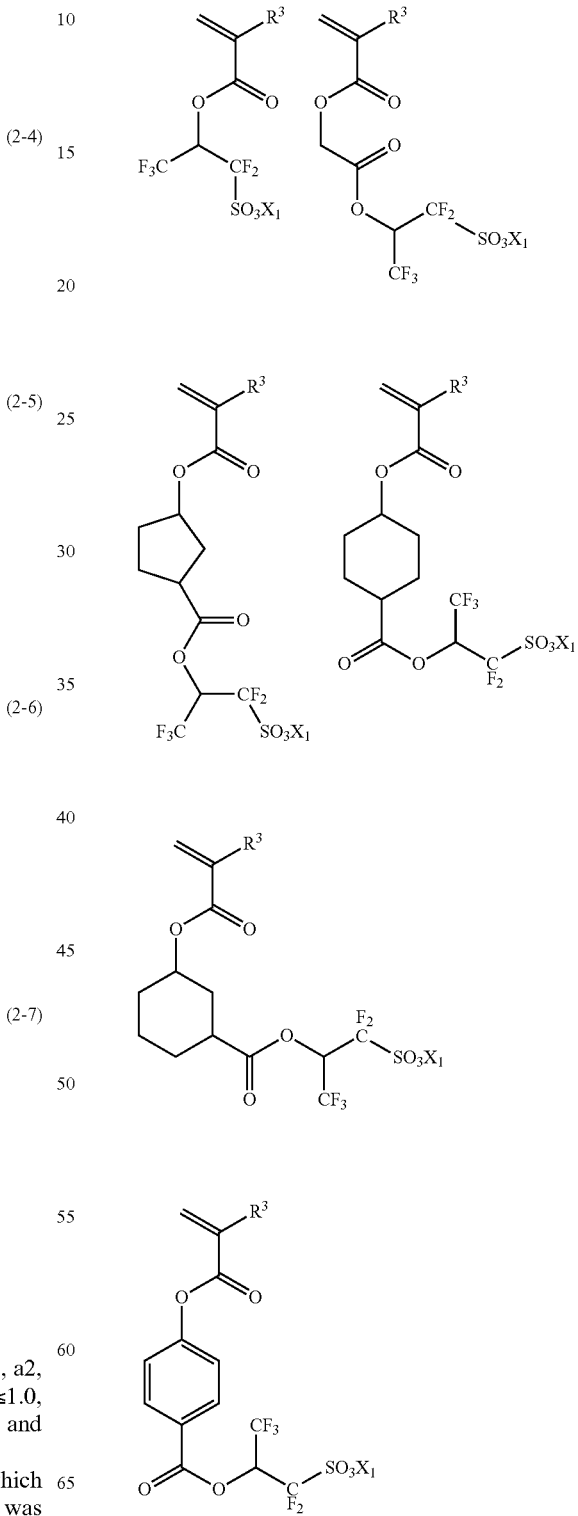

-continued
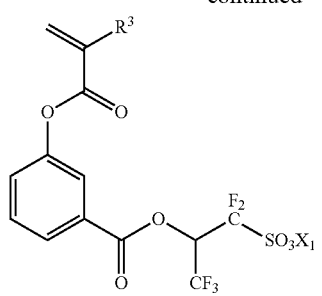
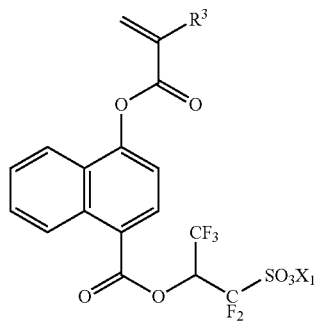
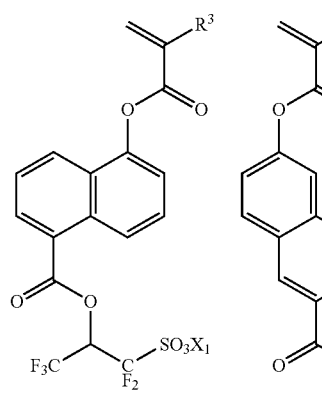
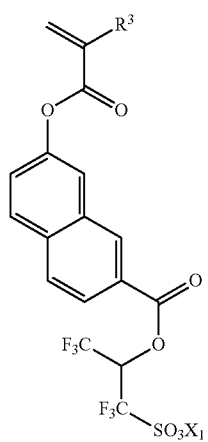
-continued
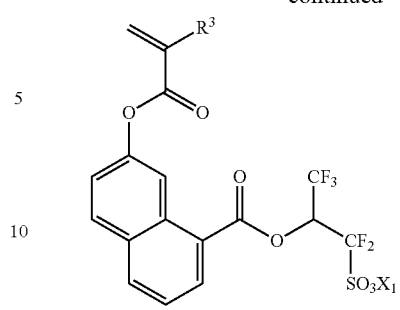
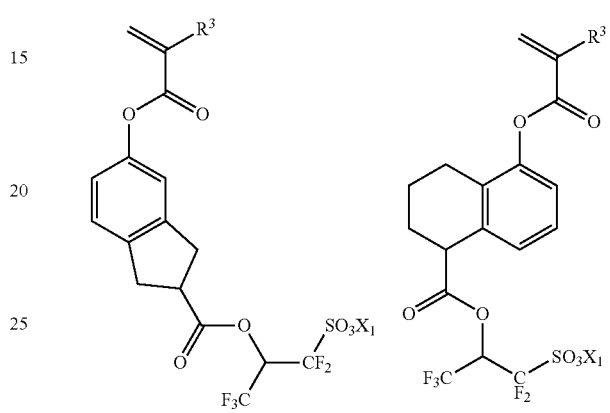
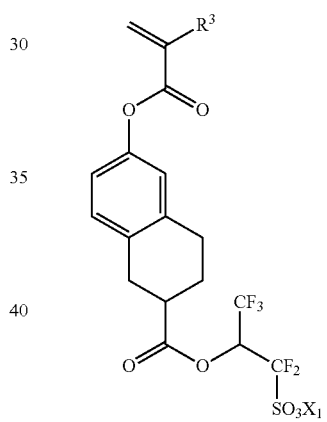
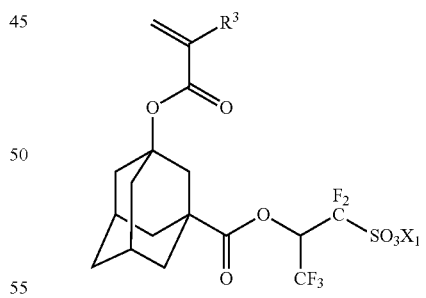
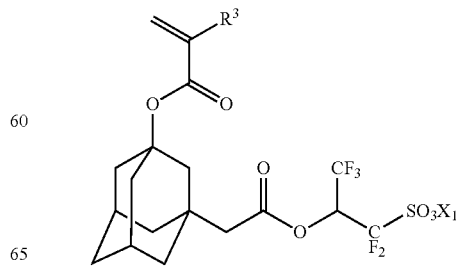

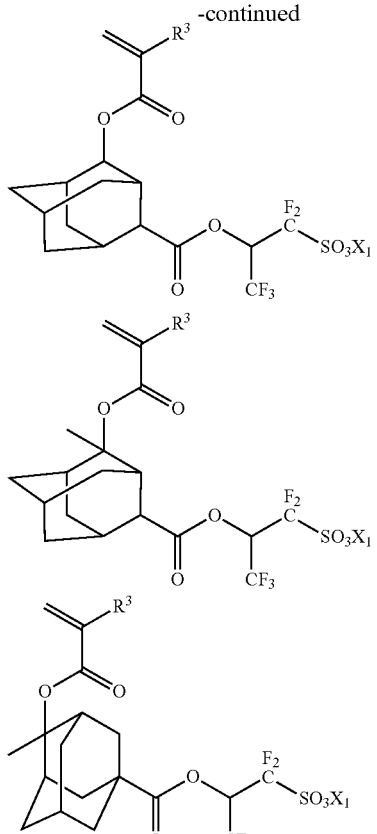
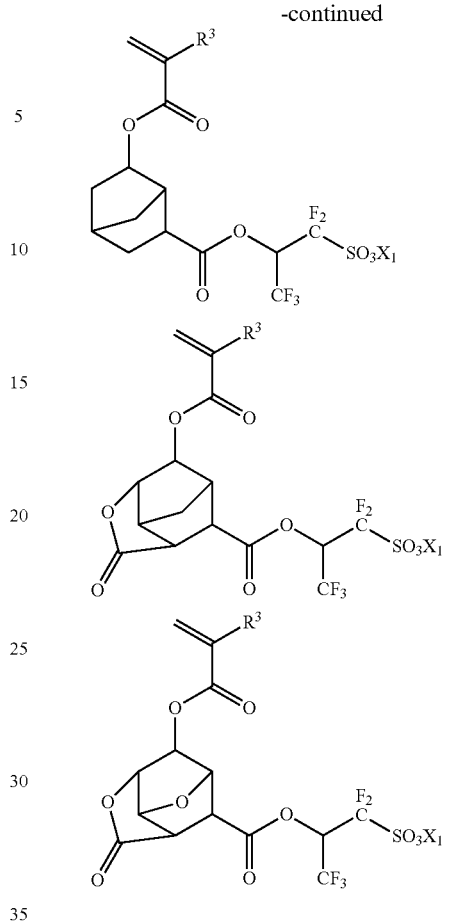
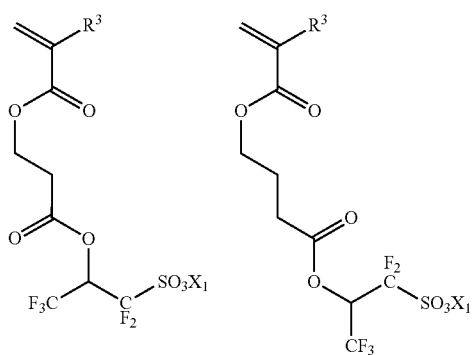
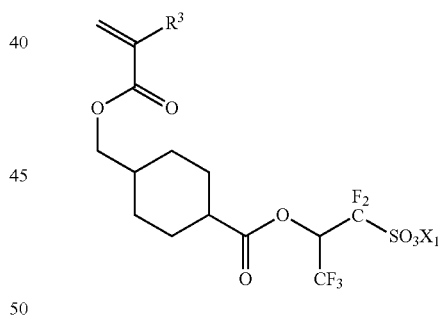
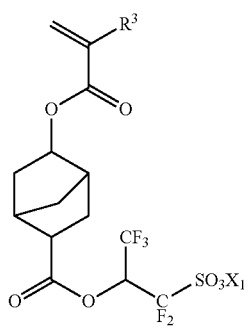

-continued
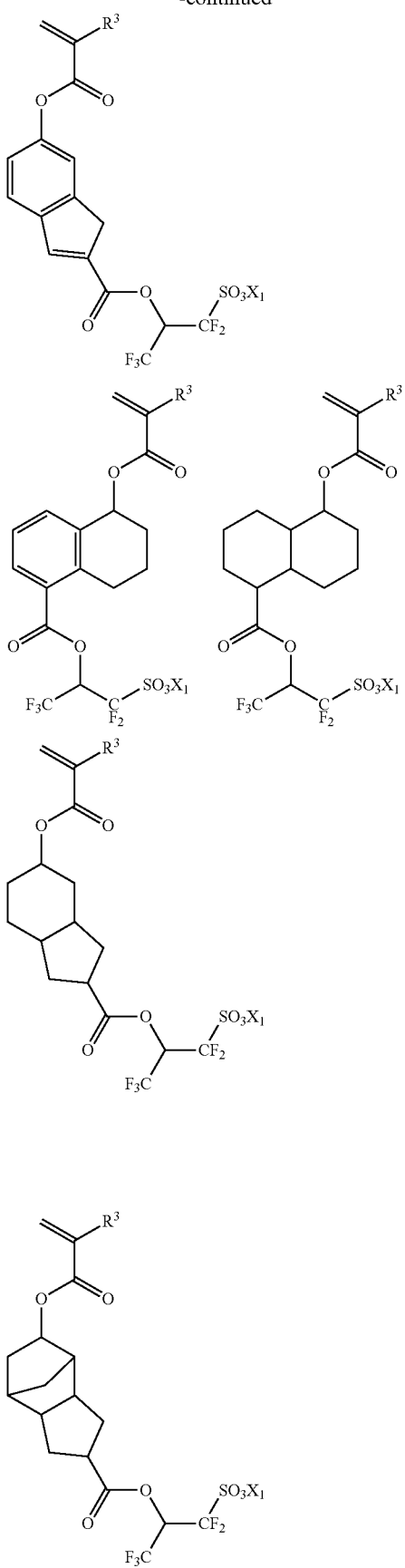
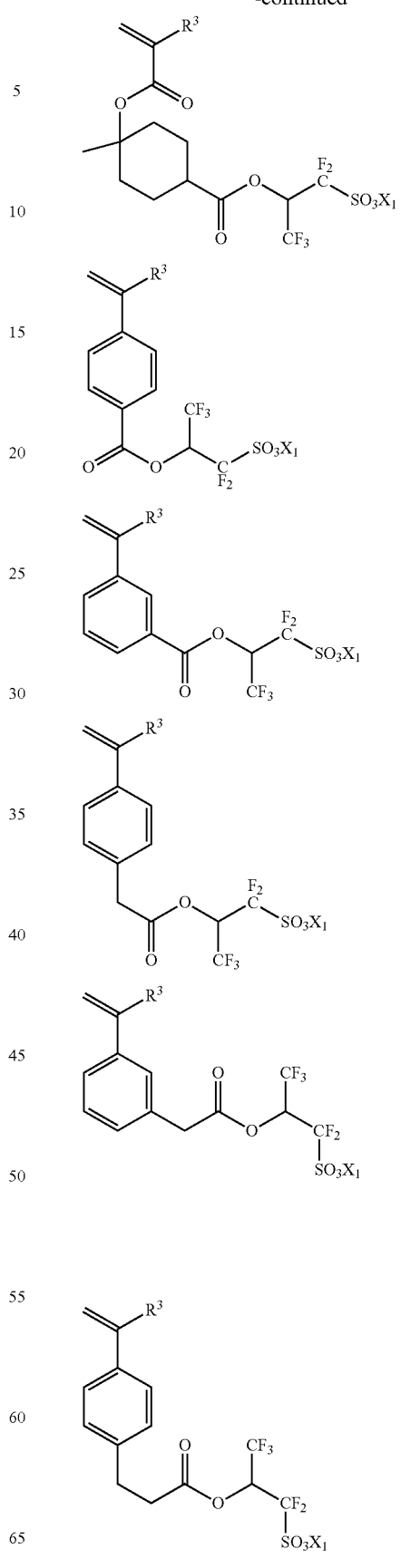

-continued

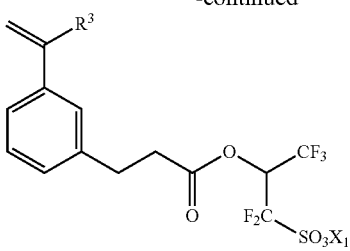
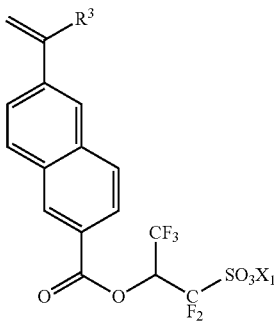
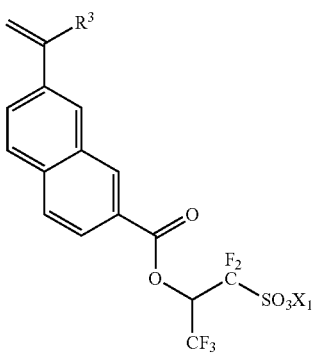
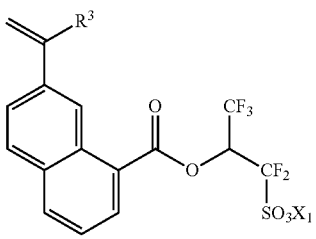
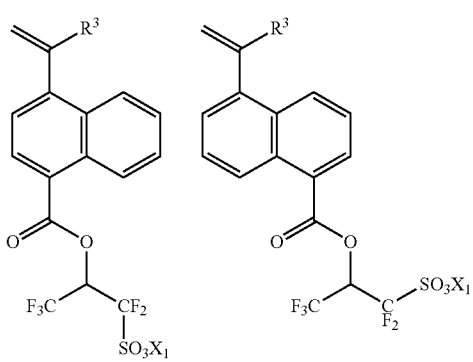

-continued

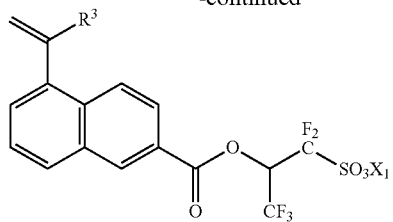

wherein $R^3$ has the same meaning as defined above; $X_1$ represents a hydrogen atom, a lithium atom, a sodium atom, a potassium atom, an amine, or a sulfonium.

Preferably, the component (B) further contains a repeating unit "b" shown by the following general formula (4). Containing such a repeating unit "b", the conductivity is further improved.

(4)

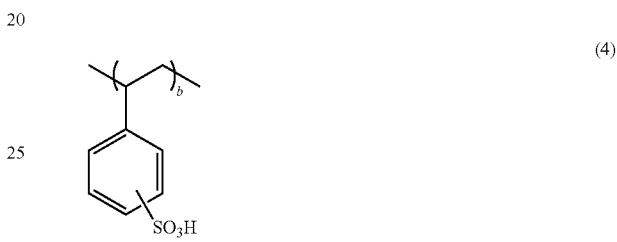

wherein "b" is $0<b<1.0$.

Illustrative examples of the monomer to give the repeating unit "b" include the following:

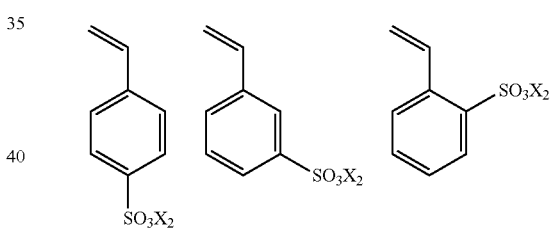

wherein $X_2$ represents a hydrogen atom, a lithium atom, a sodium atom, a potassium atom, an amine, or a sulfonium.

When each of the $X_1$ and $X_2$ is an amine, illustrative examples thereof include chemical species of (P1a-3) described on paragraph [0048] in Japanese Patent Laid-Open Publication No. 2013-228447.

As described above, the foregoing "a" is $0<a\le1.0$, preferably $0.2\le a\le1.0$. Although the effect of the present invention can be obtained when $0<a\le1.0$ (i.e. when the repeating unit "a" is contained), better effect can be obtained when $0.2\le a\le1.0$.

When the repeating unit "b" is contained, $0.3\le b<1.0$ is preferable, and $0.3\le b\le0.8$ is more preferable in view of improving the conductivity.

The ratio of the repeating unit "a" and the repeating unit "b" is preferably $0.2\le a\le0.7$ and $0.3\le b\le0.8$, more preferably $0.3\le a\le0.6$ and $0.4\le b\le0.7$.

The dopant polymer of the component (B) can contain a repeating unit "c" other than the repeating unit "a" and the repeating unit "b", and illustrative examples of this repeating unit "c" include styrenes, vinylnaphthalenes, vinylsilanes, acenaphthylene, indene, vinylcarbazole.

Illustrative examples of a monomer to give the repeating unit "c" include the following.
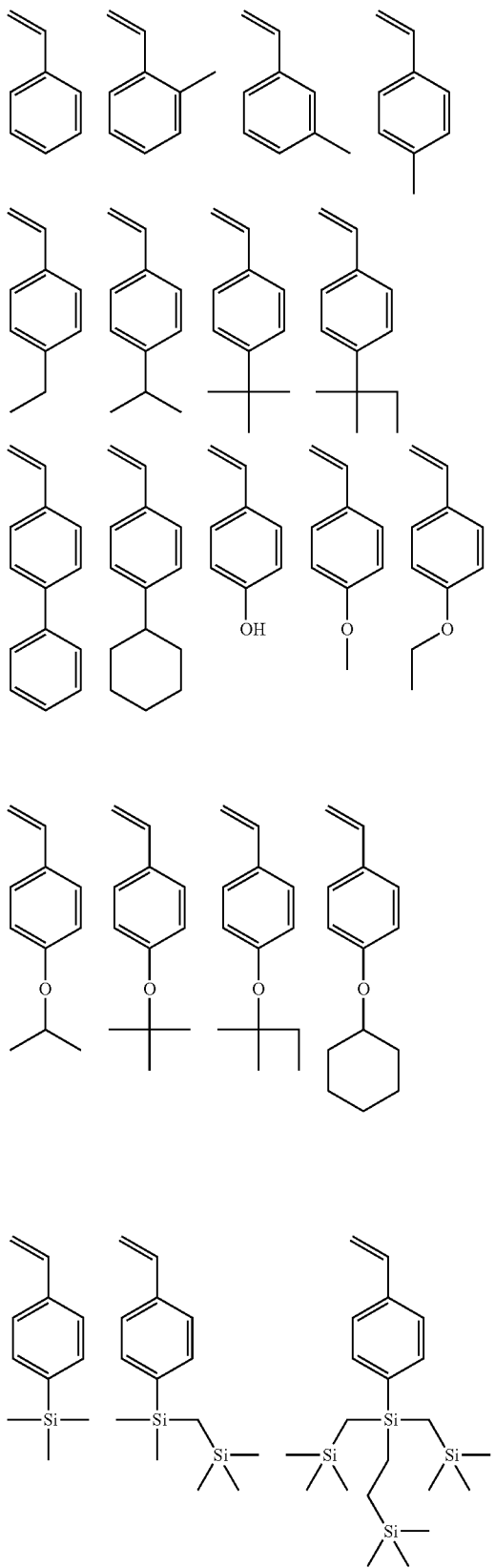
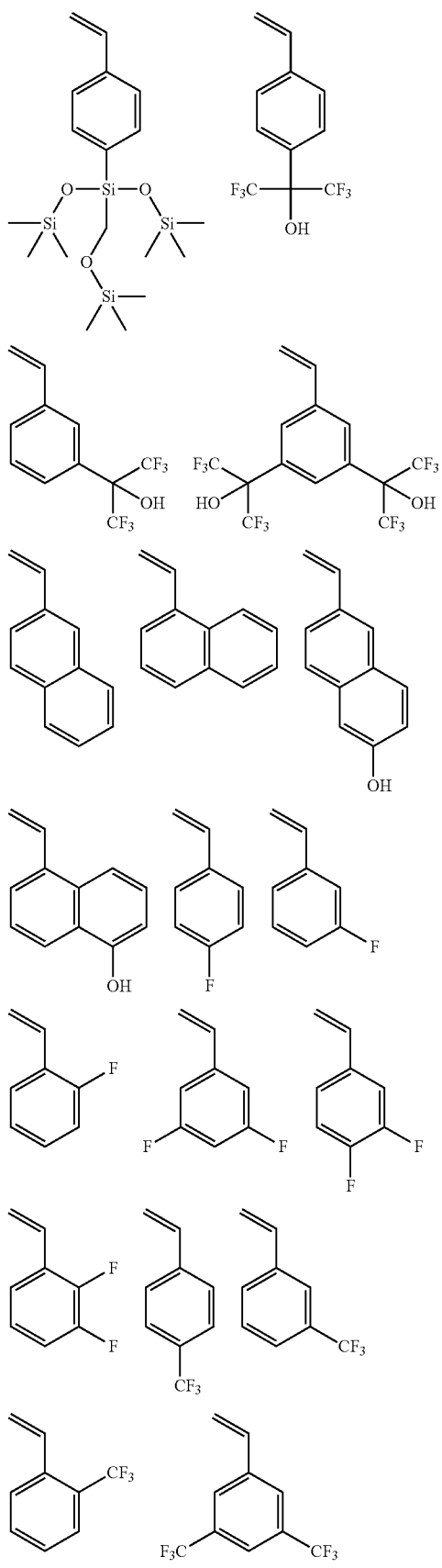

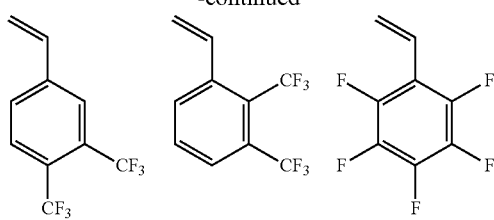
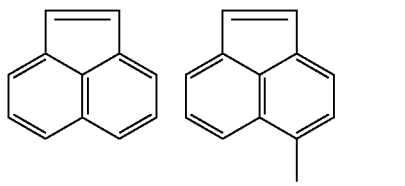
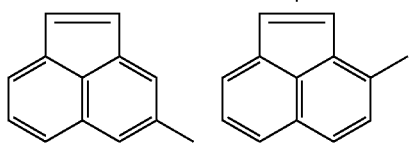
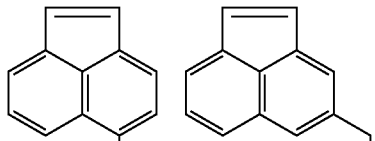
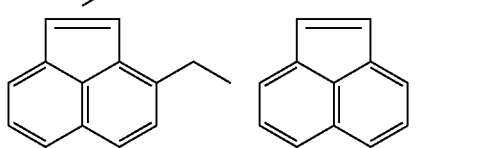
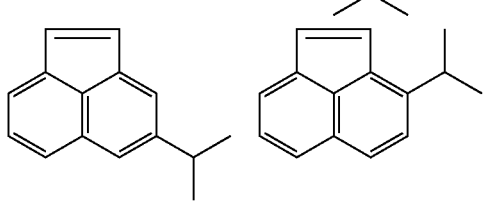
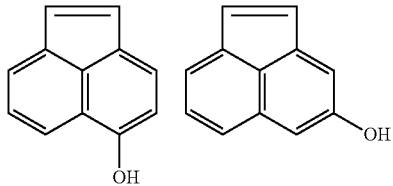
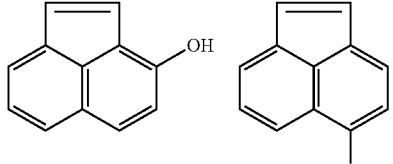
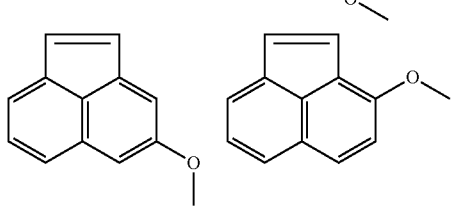
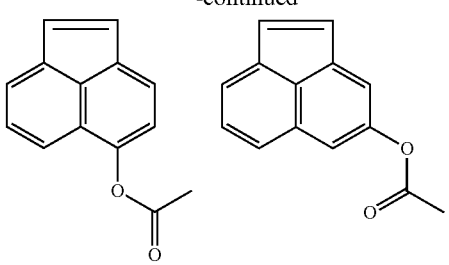
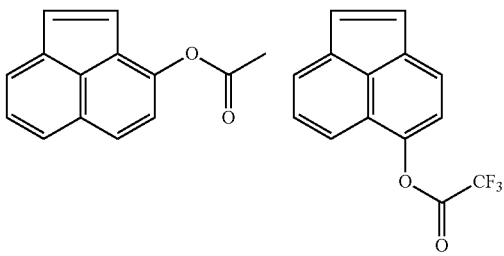
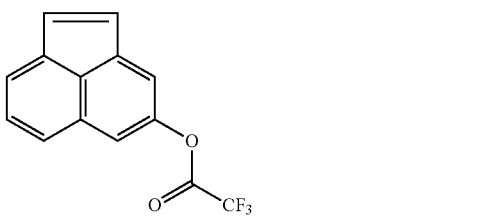
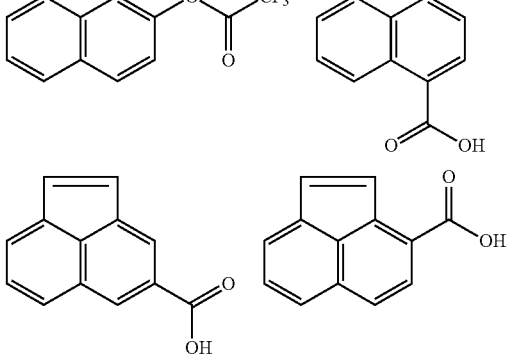
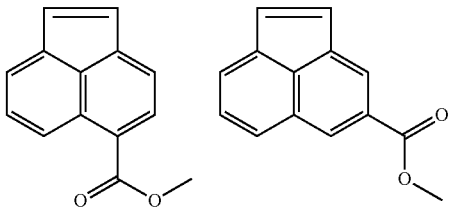
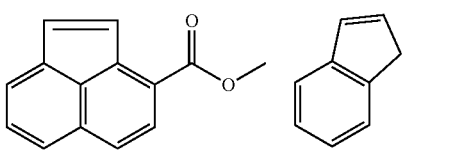
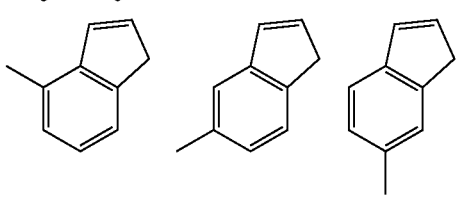

31
-continued
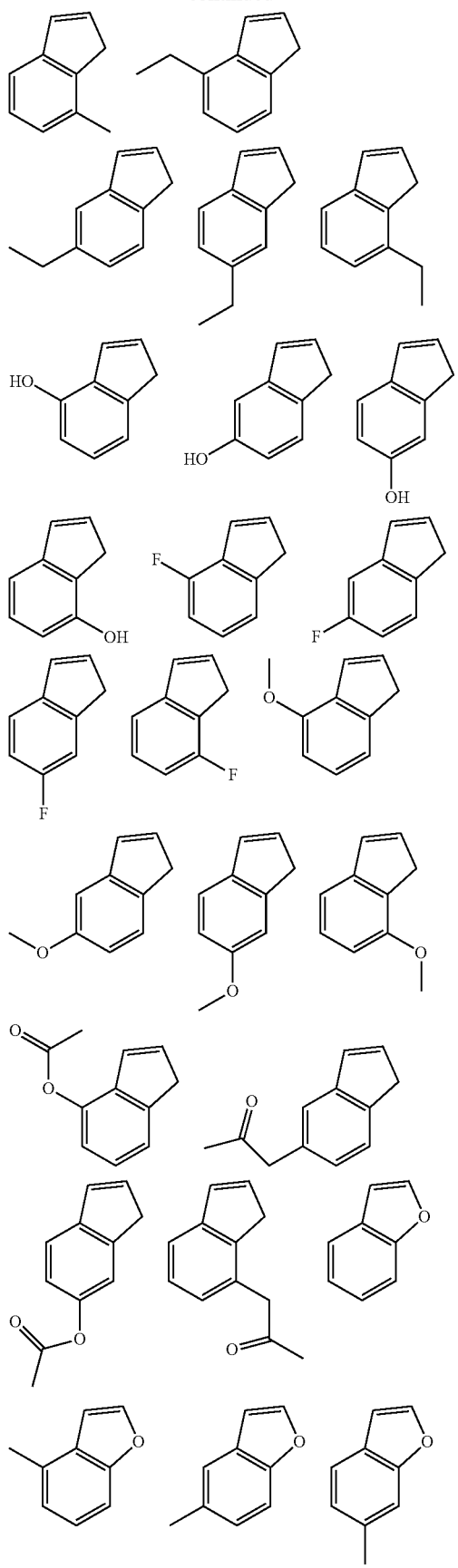
32
-continued
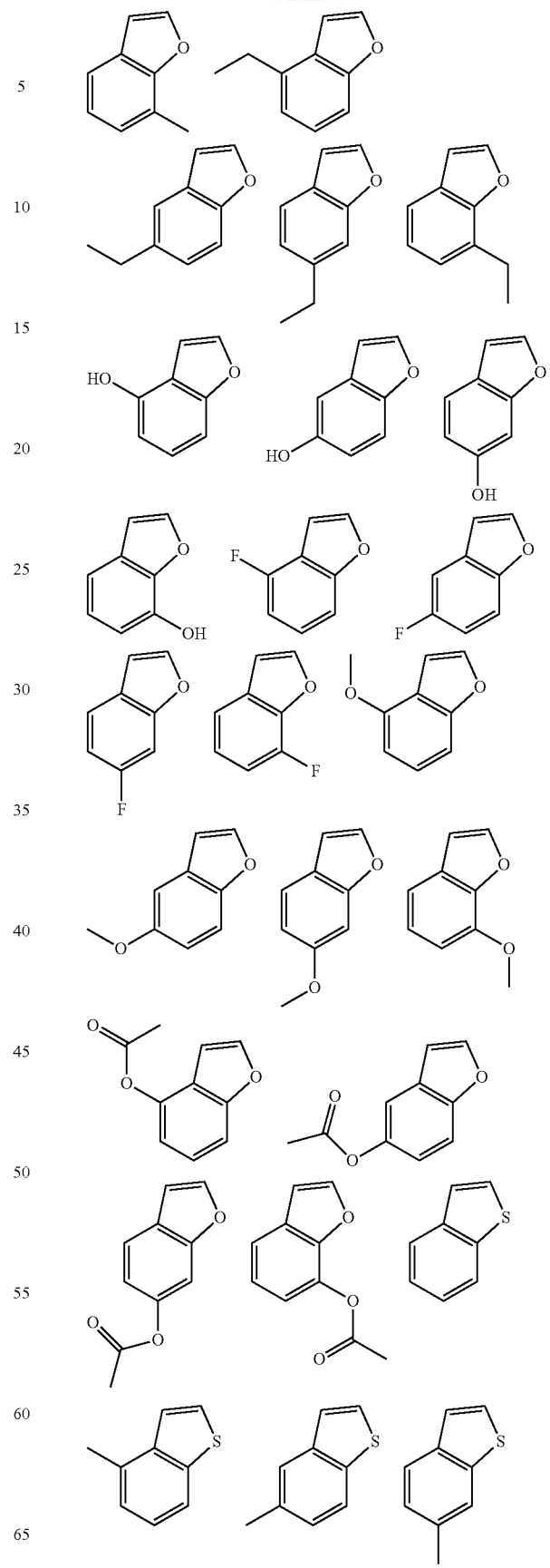

-continued

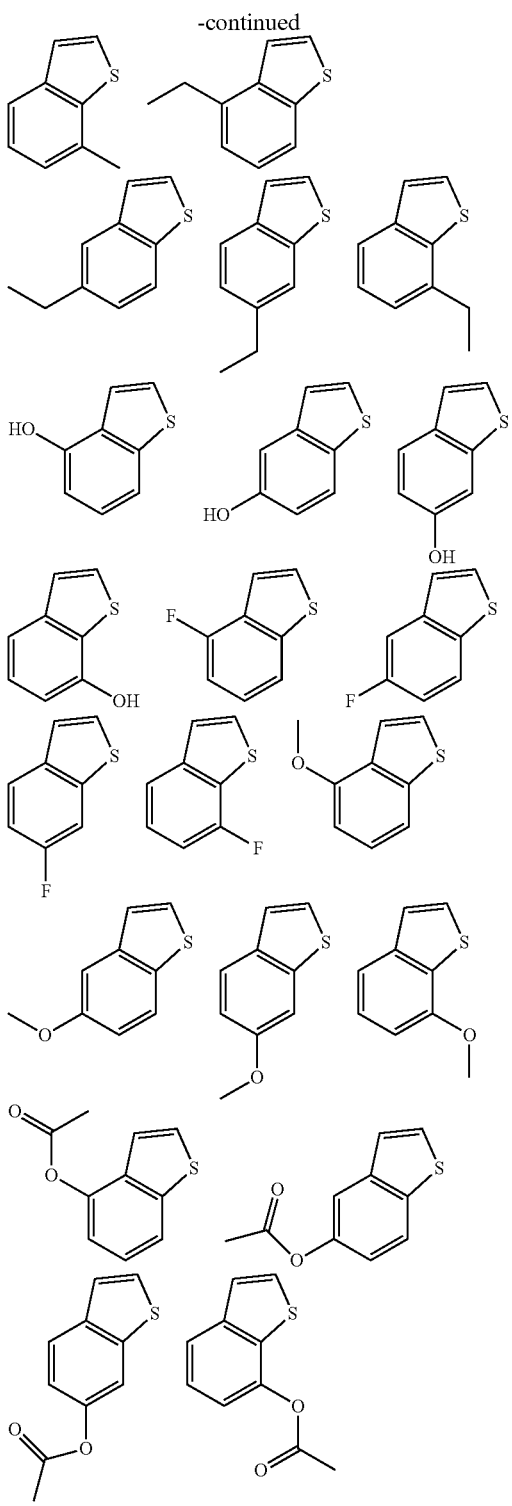

As a method for synthesizing the dopant polymer of the component (B), for example, a desired monomer(s) among the above monomers to give the repeating units "a" to "c" is/are subjected to heat polymerization in an organic solvent by adding a radical polymerization initiator to obtain a dopant polymer of a (co)polymerizate.

As the organic solvent to be used for the polymerization, there may be exemplified by toluene, benzene, tetrahydrofuran, diethyl ether, dioxane, cyclohexane, cyclopentane, methyl ethyl ketone, γ-butyrolactone, etc.

As the radical polymerization initiator, there may be exemplified by 2,2'-azobis(isobutyronitrile) (AIBN), 2,2'-azobis(2,4-dimethylvaleronitrile), dimethyl 2,2'-azobis(2-methylpropionate), benzoyl peroxide, lauroyl peroxide, etc.

The reaction temperature is preferably 50 to 80° C., and the reaction time is preferably 2 to 100 hours, more preferably 5 to 20 hours.

In the dopant polymer of the component (B), the monomer to give the repeating unit "a" may be one kind or a combination of two or more kinds, and it is preferred to combine methacryl type and styrene type monomers to heighten polymerizability.

In addition, when using two or more kinds of monomers to give the repeating unit "a", each monomer can be copolymerized to a random copolymer or a block copolymer. When a block copolymerized polymer (block copolymer) is formed, it can be expected to obtain a merit that the conductivity is improved by aggregating the repeating unit portions comprising the two or more kinds of the repeating units "a" with each other to form a sea-island structure and to generate a peculiar structure around the dopant polymer.

Furthermore, each of the monomers to give the repeating units "a" to "c" can be copolymerized randomly or copolymerized to respective blocks. In this case, it can be also expected to obtain a merit that the conductivity is improved by forming a block copolymer as in the foregoing case of the repeating unit "a".

When a random copolymerization is to be carried out by a radical polymerization, it is general to use the method in which the monomers to be copolymerized and a radical polymerization initiator are mixed and polymerized by heating. In the case that the polymerization is started with a first monomer in the presence of a radical polymerization initiator, and then adding a second monomer thereto later, the resulting polymer has a structure in which one side of the polymer molecule is a structure that the first monomer is polymerized, and the other side is a structure that the second monomer is polymerized. However, in this case, the repeating units of the first monomer and the second monomer are mixedly present at the middle portion, which is different in the structure from the block copolymer. For forming the block copolymer by radical polymerization, the living radical polymerization is preferably used.

In a living radical polymerization method called RAFT polymerization (Reversible Addition Fragmentation chain Transfer polymerization), the radical at the polymer terminal is always living, so that it is possible to form a diblock copolymer comprising a block of a repeating unit of the first monomer and a block of a repeating unit of the second monomer by starting the polymerization with the first monomer, and then adding the second monomer at the stage when the first monomer has been consumed. In addition, it is also possible to form a triblock copolymer by starting the polymerization with the first monomer, then adding the second monomer at the stage when the first monomer has been consumed, and then adding the third monomer thereto.

When the RAFT polymerization is carried out, there is a characteristic that a narrowly distributed polymer having a narrow molecular weight distribution (degree of distribution) is formed, in particular, when the RAFT polymerization is carried out by adding the monomers at once, a polymer having a narrower molecular weight distribution can be formed.

The dopant polymer of the component (B) preferably has a narrow distribution, and the molecular weight distribution (Mw/Mn) thereof is preferably 1.0 to 2.0, particularly preferably 1.0 to 1.5. If the dopant polymer has a narrow distribution, it is possible to prevent lowering of the permeability of a conductive film formed from a conductive polymer composition using the dopant polymer.

To carry out the RAFT polymerization, a chain transfer agent is necessary, and specific examples thereof may be mentioned 2-cyano-2-propyl benzothioate, 4-cyano-4-(phenylcarbonothioylthio)pentanoic acid, 2-cyano-2-propyl dodecyltrithiocarbonate, 4-cyano-4-[(dodecylsulfanylthiocarbonyl)sulfanyl]pentanoic acid, 2-(dodecylthiocarbonothioylthio)-2-methylpropanoic acid, cyanomethyl dodecylthiocarbonate, cyanomethyl methyl (phenyl) carbamothioate, bis(thiobenzoyl) disulfide, and bis(dodecylsulfanylthiocarbonyl) disulfide. Among these, 2-cyano-2-propyl benzothioate is particularly preferred.

The dopant polymer of the component (B) has a weight-average molecular weight in a range of 1,000 to 500,000, preferably in a range of 2,000 to 200,000. The weight-average molecular weight less than 1,000 deteriorates the heat resistance, and worsens the homogeneity of a composite solution with the component (A). On the other hand, the weight-average molecular weight more than 500,000 causes lowering the conductivity and an increase of the viscosity to worsen the workability and to lower the dispersibility into water or an organic solvent.

It is to be noted that the weight-average molecular weight (Mw) is a measured value in terms of polyethylene oxide, polyethylene glycol, or polystyrene by gel permeation chromatography (GPC) using water, dimethylformamide (DMF), or tetrahydrofuran (THF) as a solvent.

As a monomer to constitute the dopant polymer of the component (B), it is possible to use a monomer having a sulfa group, but it is also possible to use a lithium salt, sodium salt, potassium salt, ammonium salt, or sulfonium salt of the sulfa group as a monomer to carry out the polymerization reaction, and then to change to a sulfo group with using an ion-exchange resin after the polymerization.

[(C) Amphoteric Ion Compound]

The conductive polymer composition of the present invention contains an amphoteric ion compound as component (C). The amphoteric ion compound used for the present invention is shown by the following general formula (3).

In the present invention, any known amphoteric ion compound can be used so long as it is shown by the following general formula (3). The amphoteric ion compound of component (C) includes a betaine compound too.

The amphoteric ion compound may be used singly or in a mixture of two or more kinds.

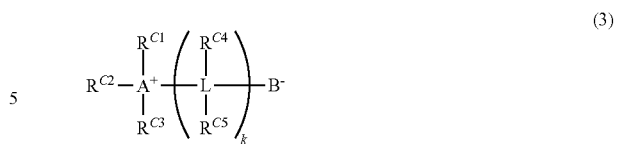

wherein $R^{C1}$ to $R^{C3}$ each independently represent a hydrogen atom, or a linear, branched, or cyclic monovalent hydrocarbon group having 1 to 20 carbon atoms and optionally substituted by a heteroatom or optionally interposed by a heteroatom; $R^{C1}$ and $R^{C2}$, or $R^{C1}$, $R^{C2}$, and $R^{C3}$ may be bonded to each other to form a ring with $A^+$ in the formula; $A^+$ is a heteroatom and represents a monovalent cation; "k" represents an integer of 1 to 8; "L" represents a carbon atom or a heteroatom, and may contain the both of them when "k" is 2 or more; $R^{C4}$ and $R^{C5}$ independently represent a hydrogen atom, a hydroxy group, an amino group, or a linear, branched, or cyclic monovalent hydrocarbon group having 1 to 20 carbon atoms and optionally interposed by a heteroatom; $R^{C4}$ and $R^{C5}$ may be bonded to each other to form a ring, and adjoining $R^{C4}$ may be bonded to each other to form a ring when "k" is 2 or more; $R^{C4}$ and $R^{C5}$ may be bonded to an oxygen atom or a nitrogen atom to form a double bond, and when $R^{C4}$ and $R^{C5}$ form a double bond with a nitrogen atom, the nitrogen atom can be an ion; "L" may form a double bond with adjoining $A^+$, and adjoining "L" may form a double bond with each other when "k" is 2 or more; any of $R^{C1}$ to $R^{C3}$ and $R^{C4}$ or $R^{C5}$ may be bonded to each other to form a ring; $B^-$ is a monovalent anionic functional group and represents a carboxylate ion or a sulfonate ion.

In the general formula (3), $A^+$ is a heteroatom and represents a monovalent cation. Illustrative examples of $A^+$ include sulfonium ion, ammonium ion.

$B^-$ is a monovalent anionic functional group and represents a carboxylate ion or a sulfonate ion. $B^-$ forms an inner salt with $A^+$ in the same molecule or intermolecularly forms a salt with $A^+$ in the adjacent molecule.

As the component (C), the one shown by the general formula (5) is more preferable:

wherein $R^{C1}$ to $R^{C5}$, $A^+$, "L", and "k" have the same meanings as defined above.

Among the amphoteric ion compound shown by the general formula (3), illustrative examples of betaine compounds having a sulfonate ion specifically include the following.

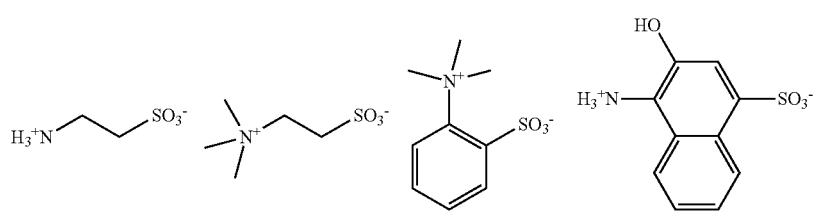

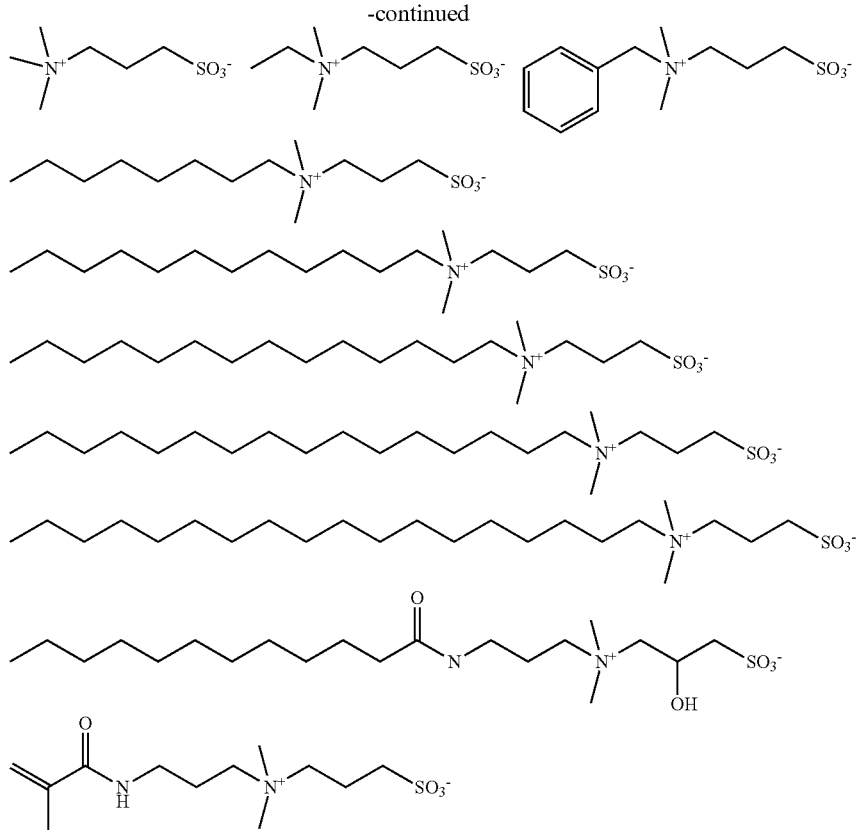
Among the amphoteric ion compound shown by the general formula (5), illustrative examples of betaine compounds having a carboxylate ion specifically include the following.
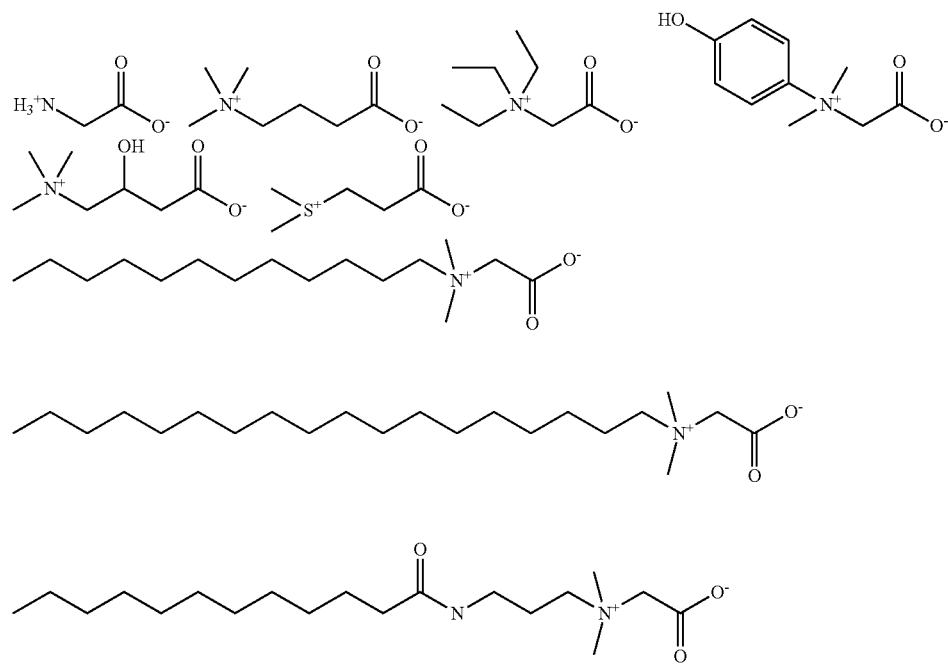

Illustrative examples of the amphoteric ion compound shown by the general formula (5) also include ionized amino acids shown below.
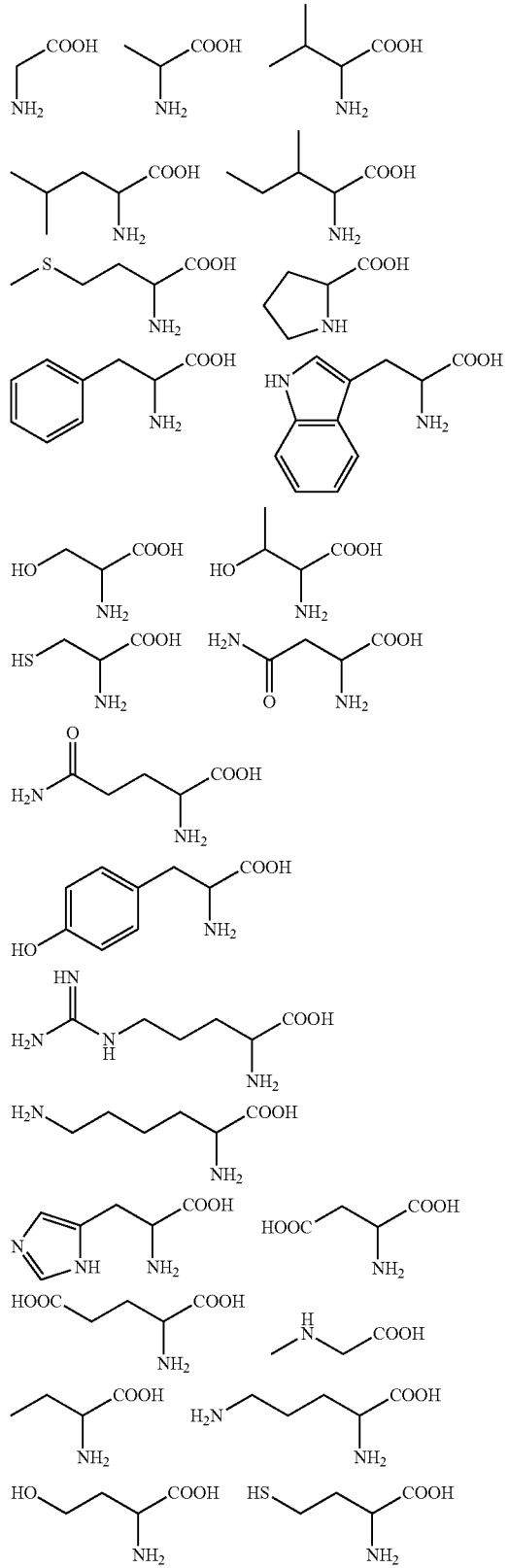
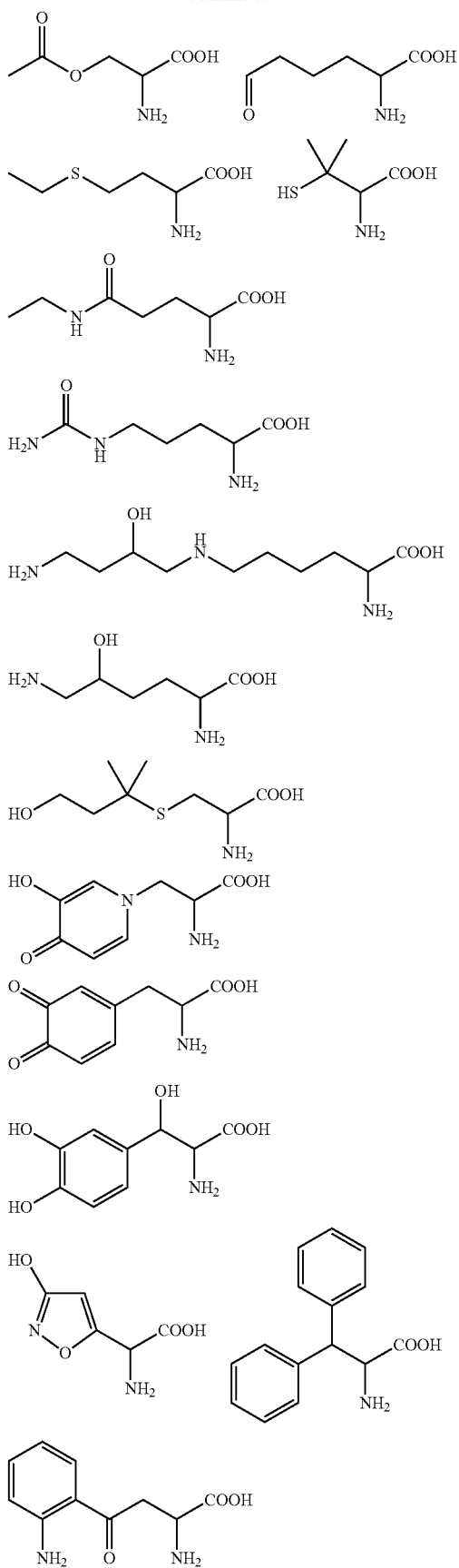

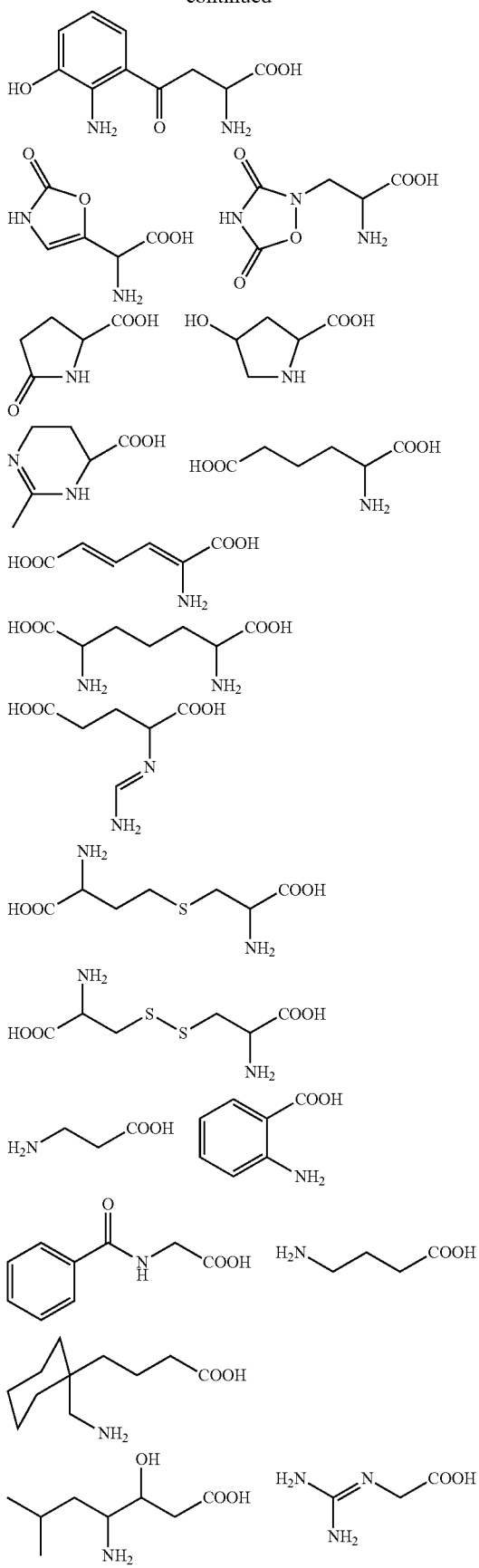
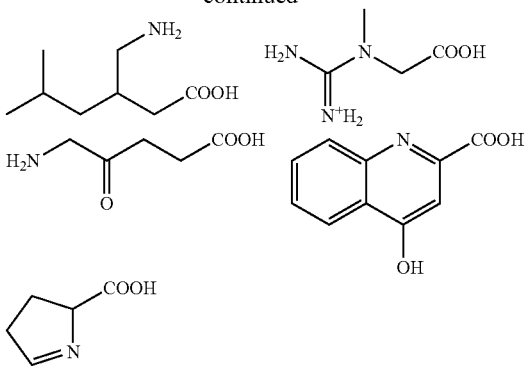

The content of the amphoteric ion compound is preferably in the range of 1 to 70 parts by mass, more preferably 1 to 50 parts by mass, further preferably 20 to 50 parts by mass, and especially 20 to 40 parts by mass based on 100 parts by mass of the composite of the component (A) and the component (B). When the amphoteric ion compound is in such an amount, acid diffusion from the antistatic film formed by the inventive conductive polymer composition to the resist layer is suppressed, so that the influence of an acid on lithography can be reduced while keeping the antistatic effect in electron beam drawing, and accordingly a resist pattern with higher resolution can be obtained. On the basis of the same effect, it is possible to obtain a resist body to be processed with small change in sensitivity over a period from film-forming to pattern development.

[Other Components]
(Surfactant)

In the present invention, a surfactant may be added to enhance the wettability to the body to be processed such as a substrate. As the surfactant, there may be mentioned various surfactants such as a nonionic type, a cationic type, an anionic type, etc. and nonionic surfactant is particularly preferable in view of stability of the conductive polymer. Illustrative examples thereof include nonionic surfactant, which is suitable, such as polyoxyethylene alkyl ether, polyoxyethylene alkyl phenyl ether, polyoxyethylene carboxylic acid ester, sorbitan ester, and polyoxyethylene sorbitan ester; cationic surfactant such as alkyltrimethylammonium chloride, alkylbenzylammonium chloride; anionic surfactant such as alkyl or alkylallyl sulfate salt, alkyl or alkylallyl sulfonate salt, and dialkyl sulfosuccinate salt; amphoteric surfactant such as amino acid type and betaine type. The blending amount of the surfactant is preferably 0.005 to 0.5% by mass, particularly 0.01 to 0.3% by mass.

The content of the nonionic surfactant is preferably in the range of 1 to 50 parts by mass, more preferably 1 to 30 parts by mass based on 100 parts by mass of the composite of the component (A) and the component (B). Such a content of the nonionic surfactant makes the wettability to the surface of a body to be processed more suitable, and gives the conductive film sufficient conductivity.

(Conductivity-Enhancing Agent)

In the present invention, the conductive polymer composition can contain an organic solvent other than the main solvents in order to improve the conductivity of the conductive polymer composition as well as the coating property and film-formability onto a resist surface or a substrate. Illustrative examples thereof include alcohols such as methanol, ethanol, propanol, and butanol; aliphatic polyvalent alcohols such as ethylene glycol, propylene glycol, 1,3-propanediol, dipropylene glycol, 1,3-butylene glycol, 1,4-butylene glycol, D-glucose, D-glucitol, isoprene glycol, 1,2-butanediol, 1,3-butanediol, 1,4-butanediol, 2,3-butanediol, 1,2-pentanediol, 1,5-pentanediol, 1,2-hexanediol, 1,6-hexanediol, 1,9-nonanediol, 1,3,5-adamantanetriol, 1,2,3-butanetriol, 1,2,4-butanetriol, 1,2,3-cyclohexanetriol, 1,3,5-cyclohexanetriol, neopentyl glycol, and polyethylene glycol; chain ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether; cyclic ethers such as dioxane and tetrahydrofuran; polar solvents such as cyclohexanone, methyl amyl ketone, ethyl acetate, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, N-methyl-2-pyrrolidone, N,N'-dimethylformamide, N,N-dimethylacetamide, dimethyl sulfoxide, sulfolane, and hexamethylenephosphor triamide; carbonate compounds such as ethylene carbonate and propylene carbonate; heterocyclic compounds such as 3-methyl-2-oxazolidinone; nitrile compounds such as acetonitrile, glutaronitrile, methoxyacetonitrile, propionitrile, and benzonitrile; and mixtures thereof. The contents of the solvent is preferably 0.1 to 10.0% by mass, particularly 3.0 to 6.0% by mass. These solvents may be added to the conductive polymer composition prior to the polymerization or subsequent to the polymerization.

<Conductive Polymer Composition>

The inventive conductive polymer composition contains the π-conjugated conductive polymer of the component (A), the dopant polymer of the component (B), and the amphoteric ion compound of the component (C) described above, and the dopant polymer of the component (B) forms a composite (conductive polymer composite) through ionic bond to the π-conjugated conductive polymer of the component (A).

The inventive conductive polymer composition preferably has a dispersibility to water or an organic solvent, and is able to improve the film-formability onto an inorganic or organic substrate (a substrate with an inorganic film or an organic film formed onto the surface) by spin coating and flatness of the film.

(Production Method of Conductive Polymer Composition)

The composite of the component (A) and the component (B) (a conductive polymer composite) can be obtained by, for example, oxidative polymerization of monomer(s) of the raw material(s) of the component (A) (preferably, thiophenes or derivatives thereof) added to an aqueous or water/organic solvent mixture solution of the component (B) through an addition of an oxidizing agent and an oxidation catalyst if needed.

Illustrative examples of the oxidizing agent and the oxidation catalyst include peroxodisulfate salts (persulfate salts) such as ammonium peroxodisulfate (ammonium persulfate), sodium peroxodisulfate (sodium persulfate), and potassium peroxodisulfate (potassium persulfate); transition metal compounds such as ferric chloride, ferric sulfate, and cupric chloride; metal oxides such as silver oxide and cesium oxide; peroxides such as hydrogen peroxide and ozone; organic peroxides such as benzoyl peroxide; and oxygen.

As the reaction solvent to be used for the oxidative polymerization, water or a mixture of water and a solvent may be used. As the solvent to be used here is preferably a solvent miscible with water and can dissolve or disperse the component (A) and the component (B). Illustrative examples thereof include alcohols such as methanol, ethanol, propanol, and butanol; polyvalent aliphatic alcohols such as ethylene glycol, propylene glycol, 1,3-propanediol, dipropylene glycol, 1,3-butylene glycol, 1,4-butylene glycol, D-glucose, D-glucitol, isoprene glycol, 1,2-butanediol, 1,3-butanediol, 1,4-butanediol, 2,3-butanediol, 1,2-pentanedial, 1,5-pentanediol, 1,2-hexanediol, 1,6-hexanediol, 1,9-nonanediol, and neopentyl glycol; chain ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether; cyclic ether compounds such as dioxane and tetrahydrofuran; polar solvents such as cyclohexanone, methyl amyl ketone, ethyl acetate, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, N-methyl-2-pyrrolidone, N,N'-dimethylformamide, N,N-dimethylacetamide, dimethyl sulfoxide, and hexamethylenephosphor triamide; carbonate compounds such as ethylene carbonate and propylene carbonate; heterocyclic compounds such as 3-methyl-2-oxazolidinone; and nitrile compounds such as acetonitrile, glutaronitrile, methoxyacetonitrile, propionitrile, and benzonitrile. These solvents may be used singly or as a mixture of two or more of them. The blending amount of these water-miscible solvents is preferably 50% by mass or less with respect to entirety of the reaction solvents.

Note that the usage amount of the organic solvent is preferably 0 to 1,000 mL, particularly preferably 0 to 500 mL, relative to 1 mole of monomers. Usage amounts of the organic solvent of 1,000 mL or less does not need large reaction vessels, thereby being economical.

Besides the dopant polymer of the component (B), it is possible to use another anion which can be doped into the π-conjugated conductive polymer of the component (A). As to the anion like this, an organic acid is preferable in view of controlling the characteristic of de-doping from the π-conjugated conductive polymer, as well as dispersibility, heat resistance, and environment resistance of the conductive polymer composition. As the organic acid, there may be mentioned an organic carboxylic acid, phenols, an organic sulfonic acid, etc.

As to the organic carboxylic acid, acids of aliphatic, aromatic, or alicyclic compound having one, or two or more carboxy groups may be used. Illustrative examples thereof include formic acid, acetic acid, oxalic acid, benzoic acid, phthalic acid, maleic acid, fumaric acid, malonic acid, tartaric acid, citric acid, lactic acid, succinic acid, monochloroacetic acid, dichloroacetic acid, trichloroacetic acid, trifluoroacetic acid, nitroacetic acid, and triphenylacetic acid.

Illustrative examples of the phenols include cresol, phenol, and xylenol.

As to the organic sulfonic acid, aliphatic, aromatic, or alicyclic sulfonic acid having one, or two or more sulfo groups may be used. Illustrative examples of the compound having one sulfo group include methanesulfonic acid, ethanesulfonic acid, 1-propanesulfonic acid, 1-butanesulfonic acid, 1-hexanesulfonic acid, 1-heptanesulfonic acid, 1-octanesulfonic acid, 1-nonanesulfonic acid, 1-decanesulfonic acid, 1-dodecanesulfonic acid, 1-tetradecanesulfonic acid, 1-pentadecanesulfonic acid, 2-bromoethanesulfonic acid, 3-chloro-2-hydroxypropanesulfonic acid, trifluoromethanesulfonic acid, colistinmethanesulfonic acid, 2-acrylamide-2-methylpropanesulfonic acid, aminomethanesulfonic acid, 1-amino-2-naphthol-4-sulfonic acid, 2-amino-5-naphthol-7-sulfonic acid, 3-aminopropanesulfonic acid, N-cyclohexyl-3-aminopropanesulfonic acid, benzenesulfonic acid, p-toluenesulfonic acid, xylenesulfonic acid, ethylbenzenesulfonic acid, propylbenzenesulfonic acid, butylbenzenesulfonic acid, pentylbenzenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, pentadecylbenzenesulfonic acid, hexadecylbenzenesulfonic acid, 2,4-dimethylbenzenesulfonic acid, dipropylbenzenesulfonic acid, 4-aminobenzenesulfonic acid, o-aminobenzenesulfonic acid, m-aminobenzenesulfonic acid, 4-amino-2-chlorotoluene-5-sulfonic acid, 4-amino-3-methylbenzene-1-sulfonic acid, 4-amino-5-methoxy-2-methylbenzenesulfonic acid, 2-amino-5-methylbenzene-1-sulfonic acid, 4-amino-2-methylbenzene-1-sulfonic acid, 5-amino-2-methylbenzene-1-sulfonic acid, 4-acetamide-3-chlorobenzenesulfonic acid, 4-chloro-3-nitrobenzenesulfonic acid, p-chlorobenzenesulfonic acid, naphthalenesulfonic acid, methylnaphthalenesulfonic acid, propylnaphthalenesulfonic acid, butylnaphthalenesulfonic acid, pentylnaphthalenesulfonic acid, dimethylnaphthalenesulfonic acid, 4-amino-1-naphthalenesulfonic acid, 8-chloronaphthalene-1-sulfonic acid, polycondensation product of naphthalenesulfonic acid and formalin, and polycondensation product of melaminesulfonic acid and formalin.

Illustrative examples of the compound containing two or more sulfo groups include ethane disulfonic acid, butane disulfonic acid, pentane disulfonic acid, decane disulfonic acid, m-benzene disulfonic acid, o-benzene disulfonic acid, p-benzene disulfonic acid, toluene disulfonic acid, xylene disulfonic acid, chlorobenzene disulfonic acid, fluorobenzene disulfonic acid, aniline-2,4-disulfonic acid, aniline-2,5-disulfonic acid, diethylbenzene disulfonic acid, dibutylbenzene disulfonic acid, naphthalene disulfonic acid, methylnaphthalene disulfonic acid, ethylnaphthalene disulfonic acid, dodecylnaphthalene disulfonic acid, pentadecylnaphthalene disulfonic acid, butylnaphthalene disulfonic acid, 2-amino-1,4-benzene disulfonic acid, 1-amino-3,8-naphthalene disulfonic acid, 3-amino-1,5-naphthalene disulfonic acid, 8-amino-1-naphthol-3,6-disulfonic acid, 4-amino-5-naphthol-2,7-disulfonic acid, anthracene disulfonic acid, butylanthracene disulfonic acid, 4-acetamide-4'-isothiocyanatostilbene-2,2'-disulfonic acid, 4-acetamide-4'-isothiocyanatostilbene-2,2'-disulfonic acid, 4-acetamide-4'-maleimidylstilbene-2,2'-disulfonic acid, 1-acetoxypyrene-3,6,8-trisulfonic acid, 7-amino-1,3,6-naphthalene trisulfonic acid, 8-aminonaphthalene-1,3,6-trisulfonic acid, and 3-amino-1,5,7-naphthalene trisulfonic acid.

These anions other than the component (B) may be added into a solution containing a raw material monomer of the component (A), the component (B), and an oxidizing agent and/or an oxidative polymerization catalyst before polymerization of the component (A). Alternatively, it may be added into the conductive polymer composite (solution) which contains the component (A) after the polymerization and the component (B).

The composite of the component (A) and the component (B) thus obtained may be used after being pulverized by a homogenizer, a ball mill, or the like, if necessary.

For pulverization, a mixer/disperser which can apply a high shear force is preferably used. Illustrative examples of the mixer/disperser include a homogenizer, a high-pressure homogenizer, and a bead mill; among them, a high-pressure homogenizer is particularly preferable.

Illustrative examples of the high-pressure homogenizer include NanoVater (manufactured by Yoshida Kikai Co., Ltd.), Microfluidizer (manufactured by Powrex Corp.), and Ultimizer (manufactured by Sugino Machine Ltd.).

As the dispersion treatment using the high-pressure homogenizer, there may be mentioned a treatment in which the composite solutions before the dispersion treatment are collided from the opposite direction with each other under high pressure, or a treatment in which the solution is passed through an orifice or a slit under high pressure.

Before or after the pulverization, impurities may be removed by the measures such as filtration, ultrafiltration, and dialysis; and also, purification may be done by using a cation-exchange resin, an anion-exchange resin, a chelate resin, or the like.

The total content of the component (A) and the component (B) in the conductive polymer composition solution is preferably in the range of 0.05 to 5.0% by mass. If the total content of the component (A) and the component (B) is 0.05% by mass or more, sufficient conductivity can be obtained; and if it is 5.0% by mass or less, the uniform conductive coating film can be readily obtained.

The content of the component (B) is preferably such an amount that the sulfo group in the component (B) is in the range of 0.1 to 10 mole, more preferably 1 to 7 mole, per 1 mole of the component (A). If the content of the sulfo group in the component (B) is 0.1 mole or more, the doping effect to the component (A) is so high that sufficient conductivity can be secured. On the other hand, if the content of the sulfo group in the component (B) is 10 mole or less, the content of the component (A) also becomes appropriate, so that sufficient conductivity can be obtained.

The inventive conductive polymer composition described above exhibits good filterability and film-formability, and can form a conductive film with good flatness and high conductivity.

The conductive polymer composition thus obtained can form a conductive film by applying it onto a body to be processed such as an electron beam resist or a substrate. Illustrative examples of the method of applying the conductive polymer composition include coating by a spin coater, a bar coater, soaking, comma coating, spray coating, roll coating, screen printing, flexographic printing, gravure printing, and ink jet printing. After applying, heat treatment by using a hot-air circulating furnace, a hot plate, or the like, or irradiation with IR light, UV light, or the like may be carried out, whereby the conductive film can be formed.

The inventive conductive polymer composition can be used for forming an antistatic film. The inventive conductive polymer composition has excellent conductivity and controlled acidity to lower the influence to the adjoined layer, and accordingly it can be used for an antistatic film in electron beam lithography drawing. In addition, it can be used for UV lithography or antistatic use for a film, glass, etc.

The present invention also provides a coated article, comprising a film formed from the conductive polymer composition of the present invention on a body to be processed. The conductive film formed from the inventive conductive polymer composition has excellent antistatic property, and accordingly it is possible to obtain high quality coated articles by coating such antistatic films onto various bodies to be processed.

Illustrative examples of the body to be processed include a glass substrate, a quartz substrate, a photomask blank substrate, a resin substrate, a silicon wafer, compound semiconductor wafers such as a gallium arsenic wafer and an indium phosphorous wafer, and flexible substrates such as a resin film, an ultra-thin-film glass, and metal foil. The surfaces of these substrates may be coated with an organic or inorganic thin-film layer in order to flatten or insulate thereof, or to prevent permeation of gas or moisture.

Illustrative examples of a coated article coated with a conductive film obtained by using the inventive conductive polymer composition include a glass substrate, a resin film, and a photoresist substrate coated with the inventive conductive polymer composition for use of an antistatic film.

The inventive conductive polymer composition can adapt to an independent step for peeling an antistatic film or a step for peeling an antistatic film involved in a developing step in an electron beam resist-drawing process, and accordingly it can be suitably used even when the body to be processed is a substrate having a chemically amplified resist film. When it is a substrate to obtain a resist pattern by pattern irradiation of electron beam, more suitable results can be obtained.

That is, the present invention provides a patterning process comprising the steps of: forming an antistatic film on a chemically amplified resist film of a substrate having the chemically amplified resist film by using the conductive polymer composition of the present invention; irradiating in a pattern with electron beam; and developing with $H_2O$ or an alkaline developer to obtain a resist pattern.

The patterning process can be performed in accordance with a conventional method except that the inventive conductive polymer composition is used, and the antistatic film formed from the conductive polymer composition can be peeled with $H_2O$ before the heating treatment and after the electron beam drawing or can be peeled with a developer in a developing step of a resist pattern after the heating treatment. Naturally, other various steps such as an etching process can be performed after the development of a resist pattern.

According to such a patterning process, electrification phenomenon during exposure can be prevented, and a pattern having high sensitivity, high resolution, and good pattern profile can be obtained.

The present invention further provides a substrate having a resist pattern obtained by the foregoing patterning process.

The inventive conductive polymer composition can also be suitably used as a material for forming a laminated film as a device constituent component in an organic thin-film device not only to an antistatic film regarding lithography. Furthermore, it can also be suitably used as a material for forming an electrode film such as a transparent electrode in an organic EL display, an organic EL illumination, a solar cell, etc. based on the excellent conductivity, film-formability, and transparency; or as a material for forming a carrier transferring film such as a carrier implanted layer and carrier transferring layer of an organic EL display, an organic EL illumination, and a solar cell in the same way based on the property to show highly efficient carrier transfer due to the π-conjugated network.

The inventive conductive polymer composition can adapt to a laminated-type constituent component in an organic thin-film device, and can be suitably used even when the under-layer is a substrate, a substrate coated with transparent electrode constituting material, or a substrate coated with transparent electrode constituting material and material for carrier implanted layer.

When a conductive film obtained by using the inventive conductive polymer composition is preferably used for use of a transparent electrode in an organic thin-film device such as an organic EL display, an organic EL illumination, a solar cell, etc., illustrative examples of the coated article include a glass substrate, a resin substrate, and flexible substrates such as a resin film, an ultra-thin-film glass, and metal foil coated with a film formed from the conductive polymer composition of the present invention. The substrate prior to be coated with a film formed from the inventive conductive polymer composition can be those on which the surface is coated with an organic or inorganic thin-film layer in order to flatten or insulate thereof, or to prevent permeation of gas or moisture.

When the inventive conductive polymer composition is preferably used for a carrier implanted layer in the organic thin-film laminated device, illustrative examples of the coated article include a glass substrate, a quartz substrate, and flexible substrates such as a resin film, an ultra-thin-film glass, and metal foil coated with a material constituting a transparent electrode. Illustrative examples of these substrates prior to be coated with a material constituting a transparent electrode include those on which the surface is coated with an organic or inorganic thin-film layer in order to flatten or insulate thereof, or to prevent permeation of gas or moisture.

When the inventive conductive polymer composition is preferably used for a carrier transferring layer in the organic thin-film laminated device, illustrative examples of the coated article include a glass substrate, a quartz substrate, and flexible substrates such as a resin film, an ultra-thin-film glass, and metal foil on which a material constituting a transparent electrode and a material for a carrier implanted layer are laminated. Illustrative examples of these substrates prior to the lamination on which each surface is coated with a material constituting a transparent electrode and a material for a carrier implanted layer include those coated with an organic or inorganic thin-film layer in order to flatten or insulate thereof, or to prevent permeation of gas or moisture.

In constitution of an organic thin-film device, the inventive conductive polymer composition, even when used as a layer for forming a multi-layer structure, does not adversely influence the adjoined layer by acid in the laminated structure. Accordingly, it is possible to avoid the deterioration and acid corrosion of materials constituting the adjoined layer at the interface after constructing the device. It is also possible to combine the adjoined layer which contains an organic/inorganic material having a reaction point with acid or metals corrodible with acid due to the low ionization energy.

As described above, the inventive conductive polymer composition can be applied to form a film onto a substrate, etc. The present invention provides a substrate having a conductive film or a carrier transferring film formed from the conductive polymer composition. The inventive conductive polymer composition can be suitably used for an antistatic film for lithography with use of electron beam, etc.; and can be suitably used for an electrode layer or a carrier transferring layer as a device constituent component in an organic thin-film device.

EXAMPLES

Hereinafter, the present invention will be specifically described with reference to Synthesis Examples, Examples, and Comparative Examples, but the present invention is not restricted thereto.

In the following, Dopant polymers 1 to 8 used in the Synthesis Examples are shown.

Dopant polymer 1

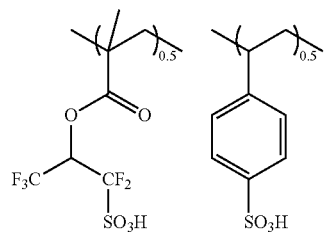

Weight-average molecular weight (Mw)=29,900
Molecular weight distribution (Mw/Mn)=1.91

Dopant polymer 2

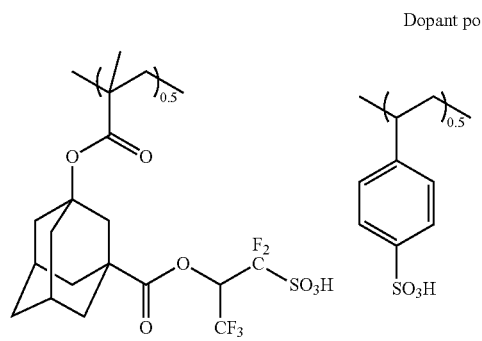

Weight-average molecular weight (Mw)=43,000
Molecular weight distribution (Mw/Mn)=1.77

Dopant polymer 3

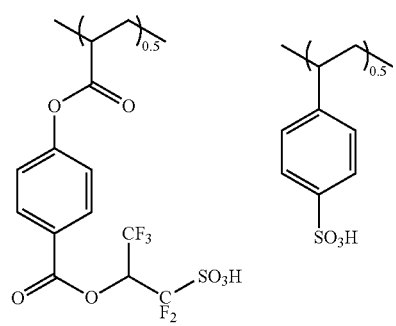

Weight-average molecular weight (Mw)=39,000
Molecular weight distribution (Mw/Mn)=1.81

Dopant polymer 4

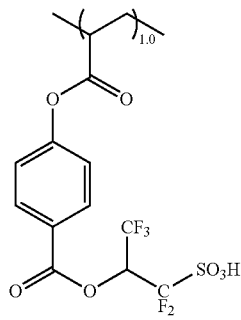

Weight-average molecular weight (Mw)=24,400
Molecular weight distribution (Mw/Mn)=1.94

Dopant polymer 5

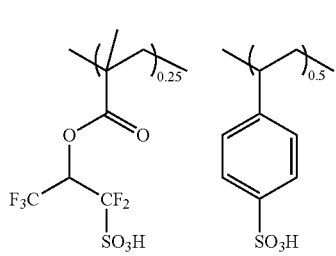

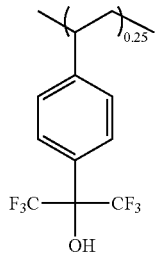

Weight-average molecular weight (Mw)=29,900
Molecular weight distribution (Mw/Mn)=1.91

Dopant polymer 6

Weight-average molecular weight (Mw)=28,700
Molecular weight distribution (Mw/Mn)=1.58

Dopant polymer 7

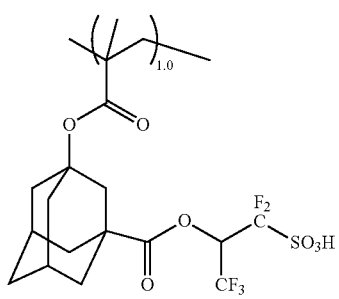

Weight-average molecular weight (Mw)=38,200
Molecular weight distribution (Mw/Mn)=1.73

Dopant polymer 8

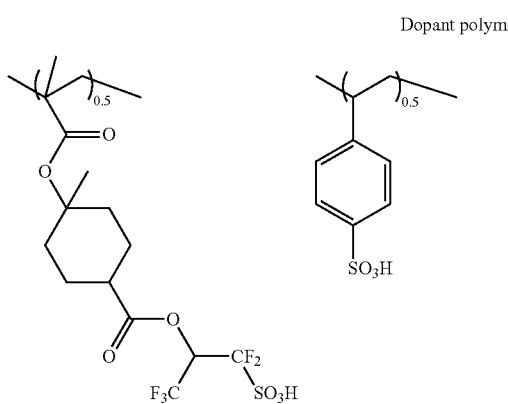

Weight-average molecular weight (Mw)=48,300
Molecular weight distribution (Mw/Mn)=1.98

[Synthesis of Composite of π-Conjugated Conductive Polymer and Dopant Polymer]

Synthesis Example 1

The solution of 15.0 g of Dopant polymer 1 dissolved in 1,000 mL of ultrapure water and 3.82 g of 3,4-ethylenedioxythiophene were mixed at 30° C.

Into the obtained mixed solution, an oxidation catalyst solution of 8.40 g of sodium persulfate and 2.3 g of ferric sulfate dissolved in 100 mL of ultrapure water was slowly added while stirring the mixed solution and keeping the temperature thereof at 30° C., and the reaction was carried out for 4 hours under stirring.

To the reaction solution thus obtained, 1,000 mL of ultrapure water was added, and about 1,000 mL of the solution was removed by ultrafiltration. This procedure was repeated 3 times.

Subsequently, 200 mL of sulfuric acid diluted to 10% by mass and 2,000 mL of ion-exchanged water were added to the solution treated with the ultrafiltration, and about 2,000 mL of the treated solution was removed by ultrafiltration; then 2,000 mL of ion-exchanged water was added thereto, and about 2,000 mL of the solution was removed again by ultrafiltration. This procedure was repeated 3 times.

The obtained treated solution was purified with cation-exchange resin and anion-exchange resin, and then 2,000 mL of ion-exchanged water was added, and about 2,000 mL of the treated solution was removed by ultrafiltration. This procedure was repeated 5 times to obtain Conductive polymer composite dispersion 1 having a blue color with a concentration of 1.0% by mass.

Conditions of the ultrafiltration were as follows.
Cut-off molecular weight of the ultrafiltration membrane: 30 K
Cross-flow method
Flow rate of the supply solution: 3,000 mL/min
Partial membrane pressure: 0.12 Pa Meanwhile, also in other Synthesis Examples, the ultrafiltration was carried out with the same conditions.

Synthesis Example 2

The same synthesis procedure as in Synthesis Example 1 was carried out, except that Dopant polymer 1 in Synthesis Example 1 was changed to Dopant polymer 2, the blending amount of 3,4-ethylenedioxythiophene was changed to 2.79 g, the blending amount of sodium persulfate was changed to 6.14 g, and the blending amount of ferric sulfate was changed to 1.67 g to obtain Conductive polymer composite dispersion 2.

Synthesis Example 3

The same synthesis procedure as in Synthesis Example 1 was carried out, except that Dopant polymer 1 in Synthesis Example 1 was changed to Dopant polymer 3, the blending amount of 3,4-ethylenedioxythiophene was changed to 3.39 g, the blending amount of sodium persulfate was changed to 7.44 g, and the blending amount of ferric sulfate was changed to 2.03 g to obtain Conductive polymer composite dispersion 3.

Synthesis Example 4

The same synthesis procedure as in Synthesis Example 1 was carried out, except that Dopant polymer 1 in Synthesis Example 1 was changed to Dopant polymer 4, the blending amount of 3,4-ethylenedioxythiophene was changed to 2.56 g, the blending amount of sodium persulfate was changed to 5.63 g, and the blending amount of ferric sulfate was changed to 1.53 g to obtain Conductive polymer composite dispersion 4.

Synthesis Example 5

The same synthesis procedure as in Synthesis Example 1 was carried out, except that Dopant polymer 1 in Synthesis Example 1 was changed to Dopant polymer 5, the blending amount of 3,4-ethylenedioxythiophene was changed to 4.77 g, the blending amount of sodium persulfate was changed to 10.49 g, and the blending amount of ferric sulfate was changed to 2.86 g to obtain Conductive polymer composite dispersion 5.

Synthesis Example 6

The same synthesis procedure as in Synthesis Example 1 was carried out, except that Dopant polymer 1 in Synthesis Example 1 was changed to Dopant polymer 6, the blending amount of 3,4-ethylenedioxythiophene was changed to 3.93 g, the blending amount of sodium persulfate was changed to 8.65 g, and the blending amount of ferric sulfate was changed to 2.36 g to obtain Conductive polymer composite dispersion 6.

Synthesis Example 7

The same synthesis procedure as in Synthesis Example 1 was carried out, except that Dopant polymer 1 in Synthesis Example 1 was changed to Dopant polymer 7, the blending amount of 3,4-ethylenedioxythiophene was changed to 3.38 g, the blending amount of sodium persulfate was changed to 7.44 g, and the blending amount of ferric sulfate was changed to 2.03 g to obtain Conductive polymer composite dispersion 7.

Synthesis Example 8

The same synthesis procedure as in Synthesis Example 1 was carried out, except that Dopant polymer 1 in Synthesis Example 1 was changed to Dopant polymer 8, the blending amount of 3,4-ethylenedioxythiophene was changed to 2.96 g, the blending amount of sodium persulfate was changed to 6.51 g, and the blending amount of ferric sulfate was changed to 1.78 g to obtain Conductive polymer composite dispersion 8.

Examples 1 to 8

To each 150.0 g of Conductive polymer composite dispersions 1 to 8 with a concentration of 1.0% by mass obtained by Synthesis Examples 1 to 8, 0.30 g of fluoroalkyl-nonionic surfactant FS-31 (manufactured by E. I. du Pont de Nemours and Company) was mixed and stirred for 2 hours at room temperature. Subsequently, to each of them, 0.90 g of L-Histidine (manufactured by Tokyo Chemical Industry Co., Ltd.) was added and stirred for 2 hours at room temperature. Then, each of them was filtrated stepwise by using a regenerated cellulose filter or a hydrophilic-treated UPE filter (manufactured by Entegris, Inc.) having a pore diameter of 1.0 to 0.05 µm to prepare a conductive polymer composition, and the respective compositions were designated as Examples 1 to 8.

Comparative Examples 1 to 8

To each 150.0 g of Conductive polymer composite dispersions 1 to 8 with a concentration of 1.0% by mass obtained by Synthesis Examples 1 to 8, 0.301 g of fluoroalkyl-nonionic surfactant FS-31 (manufactured by E. I. du Pont de Nemours and Company) was mixed and stirred for 2 hours at room temperature. Then, each of them was filtrated stepwise by using a regenerated cellulose filter or a hydrophilic-treated UPE filter (manufactured by Entegris, Inc.) having a pore diameter of 1.0 to 0.05 µm to prepare a conductive polymer composition, and the respective compositions were designated as Comparative Examples 1 to 8.

(Filterability)

In the Examples and Comparative Examples, each conductive polymer composition was purified by pre-filtration using a regenerated cellulose filter having a pore diameter of 3.0 µm (manufactured by Advantec MFS, Inc.), and subsequently subjected to filtration through a regenerated cellulose filter or a hydrophilic-treated UPE filter (manufactured by Entegris, Inc.) having a pore diameter of 1.0 to 0.05 µm, thereby examining a pore diameter of the filter capable of filtrating the composition without clogging. The liquid-passing limits of the UPE filter through which each of the conductive polymer compositions was filtrated in Examples 1 to 8 and Comparative Examples 1 to 8 are shown in Table 1.

(Resist for Evaluation)

In evaluation as an antistatic film for electron beam lithography (for electron beam resist), a positive chemically amplified electron beam resist SEEP-9012 available from Shin-Etsu Chemical Co., Ltd. was used as a positive chemically amplified resist for combined use. As to a negative chemically amplified electron beam resist, SEBN-1702 available from Shin-Etsu Chemical Co., Ltd. was used.

(Film-Forming)

Each of SEBP-9012 and SEBN-1702 was applied to a silicon wafer with a diameter of 6-inch (150 mm) by spin coating with Coater/developer CLEAN TRACK MARK VIII (manufactured by Tokyo Electron Ltd.), and baked in an accuracy incubator at 110° C. for 240 seconds to remove a solvent, thereby forming a film. On the upper-layer, each 2.0 mL of Examples 1 to 8 and Comparative Examples 1 to 8 was dropped, and then spin coated onto the entire of the resist film with a spinner. The spin-coating condition was controlled so as to give the film thickness of 100±5 nm. This was baked in an accuracy incubator at 90° C. for 5 minutes to remove the solvent, thereby obtaining an antistatic film. The thicknesses of the resist films and the antistatic films were measured by VASE (manufactured by J. A. Woollam Co., Inc.) of a spectroscopic ellipsometer with a variable incident angle.

(Peelability by Water Washing)

Each of the formed antistatic films was washed off with ion-exchanged water in a washing bottle. These were each evaluated as "good" when the antistatic film was peeled uniformly within 10 seconds, or as "poor" when non-uniform peeling or flake-form film-fall was generated, on a basis of evaluation. The results were shown in Table 1.

(pH Measurement)

The pH of the conductive polymer composition of Examples 1 to 8 and Comparative Examples 1 to 8 was measured with a pH meter D-52 (manufactured by HORIBA Ltd.). The results are shown in Table 1.

(Film-Formability)

Each was evaluated as "good" when the film could be formed uniformly, or "poor" when defect derived from particles or partial striation was generated on the film although refractive index could be measured. These results are shown in Table 1.

(Surface Resistivity)

The surface resistivity (Ω/□) of each antistatic film from Examples 1 to 8 and Comparative Examples 1 to 8 obtained by the film-forming method was measured with Loresta-GP MCP-T610 or Hiresta-UP MCP-HT450 (both are manufactured by Mitsubishi Chemical corp.). These results are shown in Table 1.

(Evaluation of Electron Beam Lithography and Change Ratio of Film Loss)

Evaluation of Peeling Process Before PEB

A positive chemically amplified resist SEEP-9012 was applied to a 6-inch silicon wafer by spin coating with MARK VIII (Coater/developer CLEAN TRACK, manufactured by Tokyo Electron Ltd.), and pre-baked at 110° C. for 240 seconds on a hot plate to prepare a resist film with a thickness of 150 nm <film thickness (T1)>. The conductive polymer composition was applied to the obtained wafer with the resist film by spin coating using MARK VIII in the same manner as described above, and baked at 90° C. for 90 seconds on a hot plate, to prepare a conductive polymer film with a thickness of 100 nm. After exposing by an electron beam exposure device (HL-800D manufactured by Hitachi High-Technologies Corporation, accelerating voltage: 50 keV), the conductive polymer film was peeled by throwing pure water for 15 seconds, baked at 90° C. for 240 seconds (PEB: post exposure bake), and subjected to development with an aqueous solution of 2.38% by mass tetramethylammonium hydroxide to obtain a positive pattern <film thickness of unexposed portion (T3)>.

Evaluation of Peeling Process after PEB

A positive chemically amplified resist SEEP-9012 was applied to a 6-inch silicon wafer by spin coating with MARK VIII (Coater/developer CLEAN TRACK, manufactured by Tokyo Electron Ltd.), and pre-baked at 110° C. for 240 seconds on a hot plate to prepare a resist film with a thickness of 150 nm <film thickness (T1)>. The conductive polymer composition was applied to the obtained wafer with the resist film by spin coating using MARK VIII in the same manner as described above, and baked at 90° C. for 90 seconds on a hot plate to prepare a conductive polymer film with a thickness of 100 nm. After exposing by an electron beam exposure device (HL-800D manufactured by Hitachi High-Technologies Corporation, accelerating voltage: 50 keV), this was baked at 90° C. for 240 seconds (PEB: post exposure bake), and subjected to development with an aqueous solution of 2.38% by mass tetramethylammonium hydroxide to obtain a positive pattern <the film thickness of an unexposed portion (T3)>.

A resist film without a conductive polymer film was also subjected to the same peeling process after PEB. The resist film thickness (T2) at the optimum exposure dose in an unexposed portion after exposure and development were determined. The change ratio in film loss (change of film thickness) was calculated from the following equation in each of the peeling processes before PEB and peeling processes after PEB. The results are shown in Table 2 and Table 3.

Change ratio of film loss in each process (%)={(T1−T3)−(T1−T2)/(T1−T2)}×100

Furthermore, the resist pattern obtained in each process was evaluated as follows.

The produced wafer with a pattern was observed under a top SEM (scanning electron microscope). The exposure dose in which a 400-nm line-and-space is resolved at a 1:1 is defined as the optimum exposure dose (sensitivity) ($\mu C/cm^2$), and the minimum dimension at the optimum exposure dose is defined as a resolution. Regarding the pattern profile, the pattern area was cleaved, and whether the pattern profile (pattern cross-sectional profile) was rectangular or not was determined by visual check of a SEM image. The results are shown in Table 2 and Table 3. The change ratio of sensitivity was calculated as a deviation (%) to the sensitivity of SEEP-9012.

A negative resist SEBN-1702 was subjected to the same process evaluation. The results are shown in Table 4 and Table 5. Since an unexposed portion was removed by a developer, the change ratio of film loss was evaluated by determining a film thickness of an exposed portion of a resist. The change ratio of sensitivity was calculated as a deviation (%) to the sensitivity of SEBN-1702.

Table 1 shows evaluations of the filterability, peelability by water washing, pH, film-formability, and surface resistivity of an antistatic film obtained from each conductive polymer composition prepared in Examples and Comparative Examples. Tables 2 to 5 show each lithography evaluation in an electron beam drawing machine of these antistatic films.

TABLE 1

|  | Filterability pore size of filter (μm) | Film-formability | Peelability by water washing | pH | Surface resistivity ($\Omega/\square$) |
|---|---|---|---|---|---|
| Example 1 | 0.05 | good | good | 6.5 | 7.77E+05 |
| Example 2 | 0.05 | good | good | 6.5 | 8.91E+05 |
| Example 3 | 0.05 | good | good | 6.8 | 8.03E+05 |
| Example 4 | 0.05 | good | good | 6.9 | 3.70E+06 |
| Example 5 | 0.05 | good | good | 6.7 | 1.00E+06 |
| Example 6 | 0.05 | good | good | 6.6 | 5.54E+05 |
| Example 7 | 0.05 | good | good | 6.9 | 7.73E+06 |
| Example 8 | 0.05 | good | good | 6.7 | 7.95E+06 |
| Comparative Example 1 | 0.05 | good | good | 2.1 | 1.33E+05 |
| Comparative Example 2 | 0.05 | good | good | 2.0 | 2.10E+05 |
| Comparative Example 3 | 0.05 | good | good | 1.9 | 1.25E+05 |
| Comparative Example 4 | 0.05 | good | good | 2.0 | 5.00E+05 |
| Comparative Example 5 | 0.05 | good | good | 2.0 | 1.00E+06 |
| Comparative Example 6 | 0.05 | good | good | 2.2 | 9.48E+04 |
| Comparative Example 7 | 0.05 | good | good | 2.3 | 1.67E+06 |
| Comparative Example 8 | 0.05 | good | good | 1.9 | 1.76E+06 |

TABLE 2

Positive-type resist
Lithography evaluation of conductive polymer composition in peeling process before PEB (Combination of SEBP-9012 and Examples 1 to 8 and Comparative Examples 1 to 8)

|  | Sensitivity ($\mu C/cm^2$) | Resolution (nm) | Change ratio of sensitivity (%) | Change ratio of film loss (%) | Pattern cross-sectional profile |
|---|---|---|---|---|---|
| SEBP-9012 only | 20.8 | 80 | — | — | rectangle |
| Example 1 | 20.7 | 80 | −0.4 | 0.2 | rectangle |
| Example 2 | 20.7 | 80 | −0.4 | 0.3 | rectangle |
| Example 3 | 20.8 | 80 | 0.0 | 0.0 | rectangle |
| Example 4 | 20.8 | 80 | 0.0 | 0.1 | rectangle |
| Example 5 | 20.8 | 80 | 0.0 | 0.0 | rectangle |
| Example 6 | 20.7 | 80 | −0.4 | 0.3 | rectangle |
| Example 7 | 20.8 | 80 | 0.0 | 0.0 | rectangle |
| Example 8 | 20.8 | 80 | 0.0 | 0.1 | rectangle |
| Comparative Example 1 | 20.1 | 80 | −3.4 | 1.5 | rectangle |
| Comparative Example 2 | 20.0 | 80 | −3.8 | 2.3 | rectangle |
| Comparative Example 3 | 19.8 | 80 | −4.8 | 1.7 | rectangle |
| Comparative Example 4 | 20.3 | 80 | −2.4 | 3.2 | rectangle |
| Comparative Example 5 | 20.2 | 80 | −2.9 | 3.3 | rectangle |
| Comparative Example 6 | 20.0 | 80 | −3.8 | 2.0 | rectangle |
| Comparative Example 7 | 20.0 | 80 | −3.8 | 2.3 | rectangle |
| Comparative Example 8 | 19.8 | 80 | −4.8 | 2.5 | rectangle |

TABLE 3

Positive-type resist
Lithography evaluation of conductive polymer composition
in peeling process after PEB (Combination of SEBP-9012
and Examples 1 to 8 and Comparative Examples 1 to 8)

| | Sensitivity ($\mu C/cm^2$) | Resolution (nm) | Change ratio of sensitivity (%) | Change ratio of film loss (%) | Pattern cross-sectional profile |
|---|---|---|---|---|---|
| SEBP-9012 only | 20.8 | 80 | — | — | rectangle |
| Example 1 | 20.3 | 80 | −2.4 | 0.7 | rectangle |
| Example 2 | 20.4 | 80 | −1.9 | 0.6 | rectangle |
| Example 3 | 20.6 | 80 | −1.0 | 0.2 | rectangle |
| Example 4 | 20.7 | 80 | −0.5 | 0.4 | rectangle |
| Example 5 | 20.7 | 80 | −0.5 | 0.2 | rectangle |
| Example 6 | 20.4 | 80 | −1.9 | 0.3 | rectangle |
| Example 7 | 20.7 | 80 | −0.5 | 0.3 | rectangle |
| Example 8 | 20.7 | 80 | −0.5 | 0.3 | rectangle |
| Comparative Example 1 | 19.5 | 80 | −6.3 | 2.3 | rectangle |
| Comparative Example 2 | 19.3 | 80 | −7.2 | 2.9 | rectangle |
| Comparative Example 3 | 19.6 | 80 | −5.8 | 2.5 | rectangle |
| Comparative Example 4 | 19.6 | 80 | −5.8 | 3.1 | rectangle |
| Comparative Example 5 | 19.5 | 80 | −6.3 | 3.7 | rectangle |
| Comparative Example 6 | 19.4 | 80 | −6.7 | 3.5 | rectangle |
| Comparative Example 7 | 19.4 | 80 | −6.7 | 3.5 | rectangle |
| Comparative Example 8 | 19.3 | 80 | −7.2 | 3.2 | rectangle |

TABLE 4

Negative-type resist
Lithography evaluation of conductive polymer composition
in peeling process before PEB (Combination of SEBN-1702
and Examples 1 to 8 and Comparative Examples 1 to 8)

| | Sensitivity ($\mu C/cm^2$) | Resolution (nm) | Change ratio of sensitivity (%) | Change ratio of film loss (%) | Pattern cross-sectional profile |
|---|---|---|---|---|---|
| SEBN-1702 only | 20.5 | 80 | — | — | rectangle |
| Example 1 | 20.8 | 80 | 1.5 | 1.0 | rectangle |
| Example 2 | 20.9 | 80 | 2.0 | 1.1 | rectangle |
| Example 3 | 20.6 | 80 | 0.5 | 0.6 | rectangle |
| Example 4 | 20.5 | 80 | 0.0 | 0.4 | rectangle |
| Example 5 | 20.6 | 80 | 0.5 | 0.5 | rectangle |
| Example 6 | 20.8 | 80 | 1.5 | 0.6 | rectangle |
| Example 7 | 20.6 | 80 | 0.5 | 0.3 | rectangle |
| Example 8 | 20.5 | 80 | 0.0 | 0.4 | rectangle |
| Comparative Example 1 | 21.3 | 80 | 3.9 | 1.8 | rectangle |
| Comparative Example 2 | 21.7 | 80 | 5.8 | 2.5 | rectangle |
| Comparative Example 3 | 21.5 | 80 | 4.9 | 2.0 | rectangle |
| Comparative Example 4 | 21.5 | 80 | 4.9 | 3.2 | rectangle |
| Comparative Example 5 | 21.0 | 80 | 2.4 | 3.2 | rectangle |
| Comparative Example 6 | 21.7 | 80 | 5.8 | 3.5 | rectangle |
| Comparative Example 7 | 21.5 | 80 | 4.9 | 3.6 | rectangle |
| Comparative Example 8 | 21.4 | 80 | 4.4 | 3.2 | rectangle |

TABLE 5

Negative-type resist
Lithography evaluation of conductive polymer composition
in peeling process after PEB (Combination of SEBN-1702
and Examples 1 to 8 and Comparative Examples 1 to 8)

| | Sensitivity ($\mu C/cm^2$) | Resolution (nm) | Change ratio of sensitivity (%) | Change ratio of film loss (%) | Pattern cross-sectional profile |
|---|---|---|---|---|---|
| SEBN-1702 only | 20.5 | 80 | — | — | rectangle |
| Example 1 | 21.1 | 80 | 2.9 | 1.3 | rectangle |
| Example 2 | 21.3 | 80 | 3.9 | 1.5 | rectangle |
| Example 3 | 20.9 | 80 | 2.0 | 0.9 | rectangle |
| Example 4 | 20.9 | 80 | 2.0 | 0.8 | rectangle |
| Example 5 | 21.0 | 80 | 2.4 | 0.7 | rectangle |
| Example 6 | 21.2 | 80 | 3.4 | 0.9 | rectangle |
| Example 7 | 21.0 | 80 | 2.4 | 0.8 | rectangle |
| Example 8 | 20.9 | 80 | 2.0 | 0.3 | rectangle |
| Comparative Example 1 | 22.3 | 80 | 8.7 | 2.3 | rectangle |
| Comparative Example 2 | 22.5 | 80 | 9.8 | 3.0 | rectangle |
| Comparative Example 3 | 22.5 | 80 | 9.8 | 2.9 | rectangle |
| Comparative Example 4 | 22.4 | 80 | 9.3 | 3.1 | rectangle |
| Comparative Example 5 | 21.8 | 80 | 6.3 | 3.0 | rectangle |
| Comparative Example 6 | 22.2 | 80 | 8.3 | 3.9 | rectangle |
| Comparative Example 7 | 22.4 | 80 | 9.3 | 3.5 | rectangle |
| Comparative Example 8 | 22.3 | 80 | 8.8 | 3.9 | rectangle |

As shown in Table 1, each inventive conductive polymer compositions of Examples 1 to 8 could give uniform coating on a resist film or a substrate with a spin coater without generating aggregation, degeneration, precipitation of a solid, etc. even after an addition of an amphoteric ion compound compared to Comparative Examples 1 to 8, in which an amphoteric ion compound had not been added, and with exhibiting good filterability, film-formability, and peelability by water washing equivalent to Comparative Examples 1 to 8. Examples 1 to 8 showed lower acidity (higher pH) compared to Comparative Examples 1 to 8, and accordingly they could lower the acid diffusion to the adjoined layer or the influence of corrosion with maintaining functions as a conductive film.

As shown in Tables 2 to 5, in the lithography evaluation using electron beam, the antistatic films obtained from the inventive conductive polymer compositions (Examples 1 to 8) exhibited good sensitivity and small sensitivity change as well as controlled change ratio of film loss.

On the other hand, in each Comparative Examples 1 to 8, an influence of acid was recognized on the resist film due to its strong acidity, the resist-forming polymer material was induced to react even in unexposed state to show the tendency of increasing the sensitivity change and change ratio of film loss.

(Electron Beam Lithography Evaluation and POD (Post Coating Delay) Evaluation)

Then, the time-dependent change due to the conductive polymer film on the resist film before irradiation with electron beam was measured. The two-layered film composed of the resist film and the conductive polymer film applied in accordance with the method described below was left in an electron beam drawing apparatus for 7 days, 14 days, or 30 days right after film formation. Then, a resist pattern was formed by peeling process before PEB or peeling process after PEB of the conductive polymer film as mentioned below. Thus, changes in pattern line width at the same sensitivity were examined, compared to the case where drawing was performed right after forming the resist film and the conductive polymer film.

Evaluation of Peeling Process Before PEB

A positive chemically amplified resist SEBP-9012 was applied to a 6-inch silicon wafer by spin coating with MARK VIII (Coater/developer CLEAN TRACK, manufactured by Tokyo Electron Ltd.), and pre-baked at 110° C. for 240 seconds on a hot plate to prepare a resist film with a thickness of 150 nm. The conductive polymer composition was applied to the obtained wafer with the resist film by spin coating using MARK VIII in the same manner as described above, and baked at 90° C. for 90 seconds on a hot plate to prepare a conductive polymer film. By using the wafer having the two-layered film composed of the resist film and the conductive polymer film, a resist pattern was formed right after the application or 7 days, 14 days, or 30 days after the application in the following manner. First, the wafer right after the application was exposed to light by using an electron beam exposure device (HL-800D manufactured by Hitachi High-Technologies Corporation, accelerating voltage: 50 keV). Then, the conductive polymer film was peeled by throwing pure water for 15 seconds, and the wafer was baked at 110° C. for 240 seconds (PEB: post exposure bake), and subjected to development with an aqueous solution of 2.38% by mass tetramethylammonium hydroxide. The produced wafer with a pattern was observed under a top SEM (scanning electron microscope). The exposure dose in which a 400-nm line and space is resolved at 1:1 is defined as optimum exposure dose (sensitivity) ($\mu C/cm^2$), and the minimum dimension in the optimum exposure dose is defined as a resolution. Similarly, a resist pattern was formed in the wafer left for 7 days, 14 days, or 30 days after the application, and changes in pattern line width were examined at the exposure dose in which a 400-nm line and space is resolved at 1:1 in the wafer right after the application (the optimum exposure dose (sensitivity) ($\mu C/cm^2$)). The results are shown in Table 6.

Evaluation of Peeling Process after PEB

Similarly to the peeling process before PEB, a wafer having the two layered film composed of the resist film and the conductive polymer film was produced. The respective wafers left for 7 days, 14 days, or 30 days after the application were baked at 110° C. for 240 seconds (PEB: post exposure bake) without the step of peeling the conductive polymer film by throwing pure water for 15 seconds after exposing to electron beam, and then subjected to development with an aqueous solution of 2.38% by mass tetramethylammonium hydroxide to obtain a resist pattern. Thus, changes in pattern line width were examined at the exposure dose in which a 400-nm line and space is resolved at 1:1 in the wafer right after the application (the optimum exposure dose (sensitivity) ($\mu C/cm^2$)). The results are shown in Table 7.

Likewise, a negative resist SEBN-1702 was subjected to the peeling process before PEB and the peeling process after PEB, and evaluated in the same manner as the positive resist SEBP-9012. The results are shown in Tables 8 and 9.

TABLE 6

Positive resist (SEBP-9012): peeling process before PEB, PCD

| | Change in PCD line width (nm) | | | |
|---|---|---|---|---|
| | Right after application | 7 days | 14 days | 30 days |
| Example 1 | 0 | −0.1 | −0.5 | −1.1 |
| Example 2 | 0 | −0.1 | −0.6 | −1.2 |
| Example 3 | 0 | −0.1 | −0.5 | −1.2 |
| Example 4 | 0 | −0.1 | −0.5 | −1.0 |
| Example 5 | 0 | −0.2 | −0.4 | −1.1 |
| Example 6 | 0 | −0.2 | −0.5 | −1.1 |
| Example 7 | 0 | −0.1 | −0.4 | −1.0 |
| Example 8 | 0 | −0.2 | −0.5 | −1.1 |
| Comparative Example 1 | 0 | −4.1 | −10.0 | −19.8 |
| Comparative Example 2 | 0 | −4.2 | −10.0 | −19.7 |
| Comparative Example 3 | 0 | −4.0 | −9.8 | −19.4 |
| Comparative Example 4 | 0 | −3.8 | −9.5 | −19.2 |
| Comparative Example 5 | 0 | −3.9 | −9.8 | −19.6 |
| Comparative Example 6 | 0 | −4.0 | −10.2 | −19.8 |
| Comparative Example 7 | 0 | −3.7 | −9.9 | −19.5 |
| Comparative Example 8 | 0 | −4.1 | −10.1 | −19.8 |

TABLE 7

Positive resist (SEBP-9012): peeling process after PEB, PCD

| | Change in PCD line width (nm) | | | |
|---|---|---|---|---|
| | Right after application | 7 days | 14 days | 30 days |
| Example 1 | 0 | −0.4 | −0.8 | −1.4 |
| Example 2 | 0 | −0.4 | −0.8 | −1.3 |
| Example 3 | 0 | −0.3 | −0.7 | −1.3 |
| Example 4 | 0 | −0.3 | −0.7 | −1.2 |
| Example 5 | 0 | −0.4 | −0.9 | −1.3 |
| Example 6 | 0 | −0.3 | −0.8 | −1.4 |
| Example 7 | 0 | −0.3 | −0.7 | −1.3 |
| Example 8 | 0 | −0.4 | −0.7 | −1.3 |
| Comparative Example 1 | 0 | −4.7 | −12.4 | −22.0 |
| Comparative Example 2 | 0 | −4.8 | −12.9 | −23.2 |
| Comparative Example 3 | 0 | −4.3 | −12.0 | −21.7 |
| Comparative Example 4 | 0 | −4.4 | −11.3 | −21.1 |
| Comparative Example 5 | 0 | −4.4 | −11.4 | −21.3 |
| Comparative Example 6 | 0 | −4.6 | −12.6 | −24.3 |
| Comparative Example 7 | 0 | −4.2 | −11.4 | −22.0 |
| Comparative Example 8 | 0 | −4.9 | −12.5 | −23.3 |

TABLE 8

Negative resist (SEBN-1702): peeling process before PEB, PCD

| | Change in PCD line width (nm) | | | |
|---|---|---|---|---|
| | Right after application | 7 days | 14 days | 30 days |
| Example 1 | 0 | 0.5 | 0.8 | 1.5 |
| Example 2 | 0 | 0.4 | 0.6 | 1.3 |
| Example 3 | 0 | 0.2 | 0.7 | 1.2 |
| Example 4 | 0 | 0.2 | 0.5 | 1.1 |
| Example 5 | 0 | 0.2 | 0.5 | 1.2 |
| Example 6 | 0 | 0.3 | 0.8 | 1.3 |
| Example 7 | 0 | 0.2 | 0.6 | 1.2 |
| Example 8 | 0 | 0.4 | 0.7 | 1.3 |
| Comparative Example 1 | 0 | 7.5 | 13.7 | 21.4 |
| Comparative Example 2 | 0 | 8.3 | 14.2 | 21.8 |
| Comparative Example 3 | 0 | 7.2 | 13.2 | 20.4 |
| Comparative Example 4 | 0 | 6.8 | 12.4 | 21.0 |
| Comparative Example 5 | 0 | 8.0 | 13.5 | 22.0 |
| Comparative Example 6 | 0 | 7.7 | 13.9 | 21.3 |
| Comparative Example 7 | 0 | 7.3 | 12.8 | 20.8 |
| Comparative Example 8 | 0 | 9.0 | 13.6 | 21.7 |

TABLE 9

Negative resist (SEBN-1702): peeling process after PEB, PCD

| | Change in PCD line width (nm) | | | |
|---|---|---|---|---|
| | Right after application | 7 days | 14 days | 30 days |
| Example 1 | 0 | 0.6 | 1.2 | 1.9 |
| Example 2 | 0 | 0.7 | 1.6 | 2.1 |
| Example 3 | 0 | 0.5 | 1.4 | 1.7 |
| Example 4 | 0 | 0.4 | 1.1 | 1.7 |
| Example 5 | 0 | 0.5 | 1.5 | 2.1 |
| Example 6 | 0 | 0.6 | 1.3 | 2.2 |
| Example 7 | 0 | 0.7 | 1.1 | 1.7 |
| Example 8 | 0 | 0.5 | 1.6 | 2.0 |
| Comparative Example 1 | 0 | 8.7 | 14.0 | 22.2 |
| Comparative Example 2 | 0 | 8.6 | 14.0 | 21.9 |
| Comparative Example 3 | 0 | 8.1 | 13.4 | 21.9 |
| Comparative Example 4 | 0 | 7.6 | 12.9 | 20.6 |
| Comparative Example 5 | 0 | 8.9 | 13.8 | 21.3 |
| Comparative Example 6 | 0 | 8.6 | 14.2 | 22.0 |
| Comparative Example 7 | 0 | 8.0 | 13.1 | 20.6 |
| Comparative Examole 8 | 0 | 8.7 | 14.5 | 21.8 |

As shown in Tables 6 to 9, in PCD (Post Coating Delay) evaluation, each composition of Examples 1 to 8, which showed lower acidity (higher pH), could maintain good storage stability of the resist film after formed onto the resist upper-layer as an antistatic film. That is, it is suggested that good lithography results can be obtained in a processes of drawing, peeling of a conductive polymer film (an antistatic film), and pattern development by suppressing acid diffusion from the conductive polymer film in a coated article in which the upper-layer of the resist film is coated with the conductive polymer film (the antistatic film) before electron beam drawing. On the other hand, in each composition of Comparative Examples 1 to 8, although the antistatic performance was slightly superior compared to Examples 1 to 8, the acidity was high, and the range of change in PCD was very large, thereby having a problem on the storage stability of the coated article of a resist and a conductive polymer film.

(Organic Solvents Resistance Test after Thin-Film Forming)

When the inventive conductive polymer composition is applied to a material constituting an organic thin-film device, in addition to the covering of the upper-layer of a resist layer coated onto a substrate, an organic layer is further laminated onto the upper-layer of the formed film of the inventive conductive polymer composition. The laminate of an organic layer includes a wet process such as spin coating, printing, etc. other than a dry process such as deposition. In application of a wet process, the formed film of a conductive polymer composition is required to have resistance to the solvent in a material of the organic layer when the organic layer is applied onto the upper-layer.

Accordingly, measurement was performed on the film loss rate at a time when a conductive polymer film formed on a substrate was brought into contact with an organic solvent. Onto a conductive polymer film coated by the following method, each organic solvent was applied by spin coating, and dried on a hot plate. Subsequently, the film thickness was measured, and compared to the film thickness before applying the organic solvent to determine the film loss rate.

On Examples 3 and 7, and Comparative Examples 3 and 7, each was applied onto a silicon wafer with a diameter of 4 inches (100 mm) by spin coating, and baked at 120° C. for 90 seconds on a hot plate to prepare a conductive polymer film with a thickness of 100 nm. The spin-coating condition was controlled so as to give the film thickness of 100±5 nm.

Each 4.0 ml of various organic solvents was brought into contact with each film of Examples 3 and 7, and Comparative Examples 3 and 7 formed as described above. This was allowed to stand for 10 seconds, and then the organic solvent was shaken off with a spin coater, dried by baking at 140° C. for 90 seconds on a hot plate, and each film thickness was measured after the drying. As a blank, the film thickness was measured on a sample dried by baking at 140° C. for 90 seconds without being in contact with an organic solvent. The organic solvents used therein were Xylene n-butyl acetate, PGMEA (=Propylene glycol monomethyl ether acetate), cyclohexanone, 1-hexanol, ethyl lactate.

The film thicknesses were measured as described above. The change value of the film thickness and the film remaining rate based on the blank were determined on the film thickness of each film of Examples 3 and 7, and Comparative Examples 3 and 7 which had been brought into contact with each organic solvent and dried by baking at 140° C. for 90 seconds. The conductivity (S/cm) and the change value of each film were calculated from measuring the surface resistivity. The film thickness was determined by VASE (manufactured by J. A. Woollam Co., Inc.) of a spectroscopic ellipsometer with a variable incident angle. After being brought into contact with each organic solvent, it was evaluated as "good" when the uniformity of the dried film was maintained, or "bad" when the surface of the film generated non-uniformity or a flow track due to the organic solvent. The results are shown in Tables 10 to 13 in an order of Example 3, Comparative Example 3, Example 7, and Comparative Example 7.

TABLE 10

| Example 3 Solvents | Change after being in contact with solvent ||||| Surface of film |
|---|---|---|---|---|---|---|
| | Film thickness ||| Conductivity || |
| | Actual value (nm) | Change value (nm) | Film remaining rate (%) | Actual value (S/cm) | Change value (S/cm) | |
| Substrate (only 120° C./90 sec. bake) | 101.5 | — | — | 1.23E−01 | — | — |
| blank (substrate + 140° C./90 sec. bake) | 101.0 | — | — | 1.22E−01 | — | good |
| Xylene | 100.6 | −0.4 | 99.6% | 1.17E−01 | −5.28E−03 | good |
| n-Butyl acetate | 100.4 | −0.6 | 99.4% | 1.14E−01 | −8.32E−03 | good |
| PGMEA | 101.1 | 0.1 | 100.1% | 1.17E−01 | −5.05E−03 | good |
| Cyclohexanone | 100.8 | −0.2 | 99.8% | 1.09E−01 | −1.28E−02 | good |
| 1-Hexanol | 100.8 | −0.2 | 99.8% | 1.17E−01 | −4.84E−03 | good |
| Ethyl lactate | 100.0 | −1.0 | 99.0% | 1.29E−01 | 7.54E−03 | good |

TABLE 11

| Comparative Example 3 Solvents | Change after being in contact with solvent ||||| Surface of film |
|---|---|---|---|---|---|---|
| | Film thickness ||| Conductivity || |
| | Actual value (nm) | Change value (nm) | Film remaining rate (%) | Actual value (S/cm) | Change value (S/cm) | |
| Substrate (only 120° C./90 sec. bake) | 101.1 | — | — | 7.92E−01 | — | — |
| blank (substrate + 140° C./90 sec. bake) | 101.4 | — | — | 7.88E−01 | — | good |
| Xylene | 101.7 | 0.3 | 100.3% | 7.18E−01 | −6.98E−02 | good |
| n-Butyl acetate | 100.1 | −1.3 | 98.7% | 2.05E+00 | 1.26E+00 | good |
| PGMEA | 97.5 | −3.9 | 96.2% | 5.84E+01 | 5.76E+01 | good |
| Cyclohexanone | 92.1 | −9.3 | 90.8% | 1.80E+02 | 1.79E+02 | bad |
| 1-Hexanol | 90.8 | −10.6 | 89.5% | 2.99E+02 | 2.99E+02 | bad |
| Ethyl lactate | 88.5 | −12.9 | 87.3% | 3.39E+02 | 3.38E+02 | bad |

TABLE 12

| Example 7 Solvents | Change after being in contact with solvent ||||| Surface of film |
|---|---|---|---|---|---|---|
| | Film thickness ||| Conductivity || |
| | Actual value (nm) | Change value (nm) | Film remaining rate (%) | Actual value (S/cm) | Change value (S/cm) | |
| Substrate (only 120° C./90 sec. bake) | 100.1 | — | — | 1.29E−02 | — | — |
| blank (substrate + 140° C./90 sec. bake) | 99.8 | — | — | 1.33E−02 | — | good |
| Xylene | 100.6 | 0.8 | 100.8% | 1.31E−02 | −1.38E−04 | good |
| n-Butyl acetate | 100.3 | 0.5 | 100.5% | 1.31E−02 | −1.89E−04 | good |
| PGMEA | 100.0 | 0.3 | 100.3% | 1.31E−02 | −1.86E−04 | good |
| Cyclohexanone | 99.9 | 0.1 | 100.1% | 1.33E−02 | 1.75E−05 | good |
| 1-Hexanol | 100.7 | 0.9 | 100.9% | 1.31E−02 | −1.97E−04 | good |
| Ethyl lactate | 99.3 | −0.5 | 99.5% | 1.41E−02 | 8.44E−04 | good |

TABLE 13

| Comparative Example 7 Solvents | Change after being in contact with solvent ||||| Surface of film |
|---|---|---|---|---|---|---|
| | Film thickness ||| Conductivity || |
| | Actual value (nm) | Change value (nm) | Film remaining rate (%) | Actual value (S/cm) | Change value (S/cm) | |
| Substrate (only 120° C./90 sec. bake) | 103.1 | — | — | 5.81E−02 | — | — |

TABLE 13-continued

| Comparative Example 7 Solvents | Change after being in contact with solvent | | | | | |
|---|---|---|---|---|---|---|
| | Film thickness | | | Conductivity | | |
| | Actual value (nm) | Change value (nm) | Film remaining rate (%) | Actual value (S/cm) | Change value (S/cm) | Surface of film |
| blank (substrate + 140° C./90 sec. bake) | 102.7 | — | — | 5.90E−02 | — | good |
| Xylene | 102.9 | −0.2 | 100.2% | 8.15E−02 | 2.25E−02 | good |
| n-Butyl acetate | 91.6 | 11.1 | 89.2% | 5.73E+01 | 5.72E+01 | good |
| PGMEA | 86.8 | 15.8 | 84.6% | 1.07E+02 | 1.07E+02 | bad |
| Cyclohexanone | 79.7 | 23.0 | 77.6% | 1.31E+02 | 1.31E+02 | bad |
| 1-Hexanol | 82.7 | 20.0 | 80.5% | 1.66E+02 | 1.66E+02 | bad |
| Ethyl lactate | 79.8 | 22.9 | 77.7% | 2.05E+02 | 2.05E+02 | bad |

In the lithography by using electron beam, the inventive conductive polymer composition could form an antistatic film in electron beam drawing by forming a film onto the upper-layer of a resist. Moreover, in each Examples 1 to 8, the acidity was low compared to Comparative Examples 1 to 8, and the resist pattern after resist development was good while maintaining the antistatic performance; further, the coated article, comprising a film formed from the conductive polymer composition (an antistatic film) on the upper-layer of a resist film, exhibited storage stability before electron beam drawing. On the other hand, in application of the inventive conductive polymer composition to an organic thin-film device, it is necessary to consider the influence of acid to the adjoined layer in a laminated structure of the device. Furthermore, when the film of the composition is formed and then the upper-layer is coated with another layer by wet processing to form a laminate, the film needs to have resistance to the organic solvent contained in the material of the foregoing another layer as a solvent.

Accordingly, organic solvents resistance tests were performed after film-forming on Example 3 and Example 7, and the results were compared with Comparative Example 3 and Comparative Example 7, in which the same tests were performed, as shown in Tables 10 to 13. In comparison of the film remaining rate and the change of conductivity after being in contact with each organic solvent, the film remaining rate was very high and the change of conductivity was small in each of Example 3 and Example 7, which contained an amphoteric ion compound. On the other hand, in each of Comparative Example 3 and Comparative Example 7, which did not contain an amphoteric ion compound, the change of film thickness were larger and the rates of film residue were smaller when being in contact with an organic solvent with higher polarity. Regarding the conductivity, the changes were larger when being in contact with an organic solvent with higher polarity due to an influence of penetration of the organic solvent into the film.

As described above, the inventive conductive polymer composition has excellent antistatic performance in electron beam-resist drawing and can form an antistatic film in which the influence of acid to a resist is minimized. The inventive conductive polymer composition suppresses the influence of acid to the adjoined layer in an organic thin-film device. Moreover, in a process for producing a laminated structure, when forming a film by wet processing onto the upper-layer of the coated article comprising a film formed from the inventive conductive polymer composition, the film formed from the inventive conductive polymer composition shows resistance to the organic solvent contained in a material for forming an upper-layer. Accordingly, it has revealed that the inventive conductive polymer composition can be suitably used as a material for constituting a device.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A conductive polymer composition comprising:
(A) a π-conjugated conductive polymer having at least one repeating unit shown by the following general formulae (1-1), (1-2), and (1-3),

(1-1)

(1-2)

(1-3)

wherein "X" represents S, O, Se, Te, or NR⁵; R¹ and R² each independently represents a hydrogen atom, a hydroxy group, a halogen atom, or a linear, branched, or cyclic monovalent hydrocarbon group having 1 to 20 carbon atoms and optionally containing a heteroatom; R¹ and R² may be bonded to each other at any positions to form a ring; and R⁵ represents a hydrogen atom, a linear or branched saturated or unsaturated alkyl group having 1 to 10 carbon atoms, or a substituted or unsubstituted aryl group having 6 to 10 carbon atoms;
(B) a dopant polymer which contains a repeating unit shown by the following general formula (2), and the dopant polymer has a weight-average molecular weight in a range of 1,000 to 500,000,

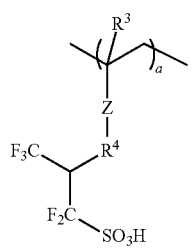

(2)

wherein $R^3$ represents a hydrogen atom or a methyl group; $R^4$ represents a single bond, an ester group, or a linear, branched, or cyclic hydrocarbon group having 1 to 12 carbon atoms and optionally containing either or both of an ether group and an ester group; "Z" represents a phenylene group, a naphthylene group, or an ester group; and "a" is $0 \leq a \leq 1.0$; and (C) an amphoteric ion compound shown by the following general formula (3), wherein the component (C) is present in the polymer composition in an amount of 1 to 70 parts by mass based on 100 parts by mass of the combined amounts of the component (A) and the component (B),

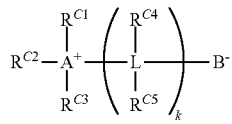

(3)

wherein $R^{C1}$ to $R^{C3}$ each independently represents a hydrogen atom, or a linear, branched, or cyclic monovalent hydrocarbon group having 1 to 20 carbon atoms and optionally substituted by a heteroatom or optionally interposed by a heteroatom; $R^{C1}$ and $R^{C2}$, or $R^{C1}$, $R^{C2}$, and $R^{C3}$ may be bonded to each other to form a ring with $A^+$ in the formula; $A^+$ is a heteroatom and represents a monovalent cation; "k" represents an integer of 1 to 8; "L" represents a carbon atom or a heteroatom, and may contain the both of them when "k" is 2 or more; $R^{C4}$ and $R^{C5}$ independently represent a hydrogen atom, a hydroxy group, an amino group, or a linear, branched, or cyclic monovalent hydrocarbon group having 1 to 20 carbon atoms and optionally interposed by a heteroatom; $R^{C4}$ and $R^{C5}$ may be bonded to each other to form a ring, and adjoining $R^{C4}$ may be bonded to each other to form a ring when "k" is 2 or more; $R^{C4}$ and $R^{C5}$ may be bonded to an oxygen atom or a nitrogen atom to form a double bond, and when $R^{C4}$ and $R^{C5}$ form a double bond with the nitrogen atom, the nitrogen atom can be an ion; "L" may form a double bond with adjoining $A^+$, and adjoining "L" may form a double bond with each other when "k" is 2 or more; any of $R^{C1}$ to $R^{C3}$ may be bonded to $R^{C4}$ or $R^{C5}$ to form a ring; and $B^-$ is a monovalent anionic functional group and represents a carboxylate ion or a sulfonate ion.

2. The conductive polymer composition according to claim 1, wherein the repeating unit in the component (B) contains one or more repeating units selected from repeating units shown by the following general formulae (2-1) to (2-7),

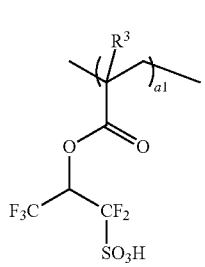

(2-1)

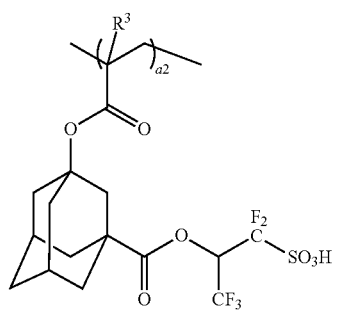

(2-2)

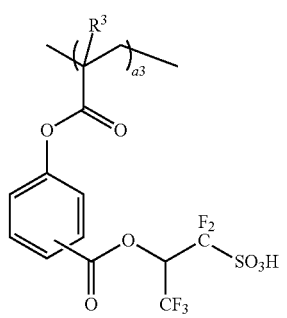

(2-3)

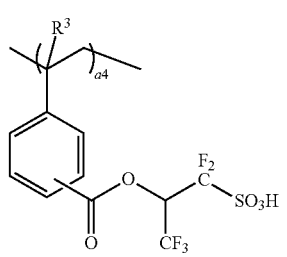

(2-4)

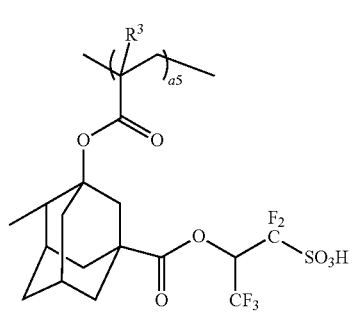

(2-5)

-continued

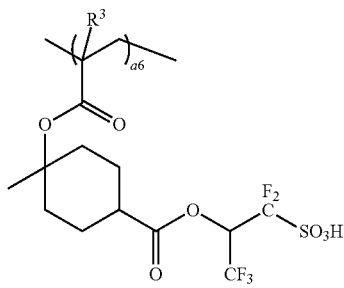
(2-6)

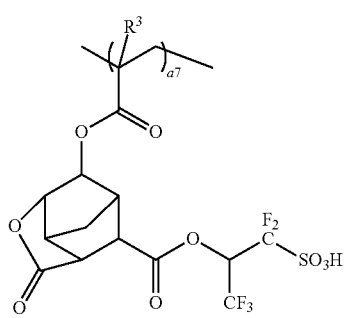
(2-7)

wherein $R^3$ has the same meaning as defined above; a1, a2, a3, a4, a5, a6, and a7 are, respectively, $0 \le a1 \le 1.0$, $0 \le a2 \le 1.0$, $0 \le a3 \le 1.0$, $0 \le a4 \le 1.0$, $0 \le a5 \le 1.0$, $0 \le a6 \le 1.0$, $0 \le a7 \le 1.0$, and $0 < a1+a2+a3+a4+a5+a6+a7 \le 1.0$.

3. The conductive polymer composition according to claim 2, wherein the component (B) further contains a repeating unit shown by the following general formula (4),

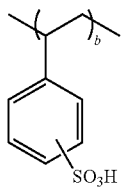
(4)

wherein "b" is $0 < b < 1.0$.

4. The conductive polymer composition according to claim 3, wherein the component (C) is shown by the general formula (5),

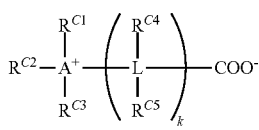
(5)

wherein $R^{C1}$ to $R^{C5}$, $A^+$, "L", and "k" have the same meanings as defined above.

5. The conductive polymer composition according to claim 2, wherein the component (C) is shown by the general formula (5),

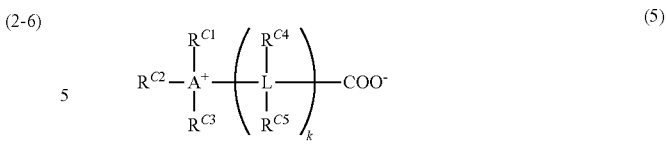
(5)

wherein $R^{C1}$ to $R^{C5}$, $A^+$, "L", and "k" have the same meanings as defined above.

6. The conductive polymer composition according to claim 2, wherein the component (C) is in an amount of 20 to 50 parts by mass based on 100 parts by mass of the combined amounts of the component (A) and the component (B).

7. The conductive polymer composition according to claim 1, wherein the component (B) further contains a repeating unit shown by the following general formula (4),

(4)

wherein "b" is $0 < b < 1.0$.

8. The conductive polymer composition according to claim 7, wherein the component (C) is shown by the general formula (5),

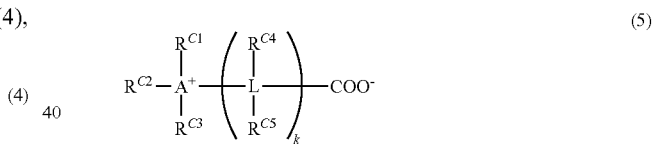
(5)

wherein $R^{C1}$ to $R^{C5}$, $A^+$, "L", and "k" have the same meanings as defined above.

9. The conductive polymer composition according to claim 1, wherein the component (C) is shown by the general formula (5),

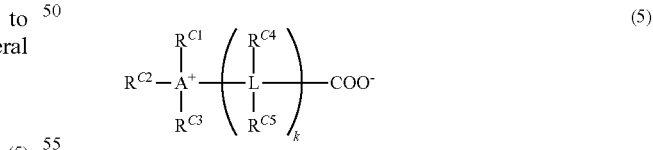
(5)

wherein $R^{C1}$ to $R^{C5}$, $A^+$, "L", and "k" have the same meanings as defined above.

10. The conductive polymer composition according to claim 1, wherein the component (C) is in an amount of 20 to 50 parts by mass based on 100 parts by mass of the combined amounts of the component (A) and the component (B).

11. The conductive polymer composition according to claim 1, further comprising a nonionic surfactant.

12. The conductive polymer composition according to claim 11, wherein the nonionic surfactant is in an amount of 1 to 50 parts by mass based on 100 parts by mass of the combined amounts of the component (A) and the component (B).

13. An organic thin-film device comprising a laminated film formed from the conductive polymer composition according to claim 1, wherein the laminated film is configured to be a device constituent component in the organic thin-film device.

14. The organic thin-film device according to claim 13, wherein the film is an electrode film or a carrier transferring film.

15. A coated article, comprising a film formed from the conductive polymer composition according to claim 1 on a body to be processed.

16. The coated article according to claim 15, wherein the body to be processed is a substrate having a chemically amplified resist film.

17. The coated article according to claim 16, wherein the body to be processed is a substrate for obtaining a resist pattern by pattern irradiation with electron beam.

18. A patterning process comprising the steps of: forming an antistatic film on a substrate having a chemically amplified resist film by using the conductive polymer composition according to claim 1; irradiating the substrate with an electron beam in a pattern; and developing with an alkaline developer to obtain a resist pattern.

* * * * *